US012652979B2

(12) United States Patent  
Lin et al.

(10) Patent No.: US 12,652,979 B2  
(45) Date of Patent: Jun. 9, 2026

(54) METHOD FOR ETCHING A LAYER THROUGH A PATTERNED MASK LAYER

(71) Applicant: Tokyo Electron Limited, Tokyo (JP)

(72) Inventors: Kangyi Lin, Albany, NY (US); Peng Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 173 days.

(21) Appl. No.: 18/611,533

(22) Filed: Mar. 20, 2024

(65) Prior Publication Data

US 2025/0299962 A1    Sep. 25, 2025

(51) Int. Cl.
| | |
|---|---|
| *H10P 50/24* | (2026.01) |
| *H10P 14/68* | (2026.01) |
| *H10P 50/00* | (2026.01) |
| *H10P 72/00* | (2026.01) |
| *H10P 72/30* | (2026.01) |

(52) U.S. Cl.
CPC .......... *H10P 50/242* (2026.01); *H10P 14/687* (2026.01); *H10P 50/695* (2026.01); *H10P 72/0404* (2026.01); *H10P 72/33* (2026.01)

(58) Field of Classification Search
None
See application file for complete search history.

(56) References Cited

U.S. PATENT DOCUMENTS

| | | |
|---|---|---|
| 2006/0037701 A1 | 2/2006 | Koshiishi et al. |
| 2006/0037703 A1 | 2/2006 | Koshiishi et al. |

| | | | |
|---|---|---|---|
| 2015/0162168 A1 | 6/2015 | Oehrlein et al. | |
| 2018/0068852 A1* | 3/2018 | Cottle ................... | H10P 50/283 |
| 2018/0102253 A1* | 4/2018 | Basavalingappa .... | H10P 50/242 |
| 2018/0102257 A1* | 4/2018 | Nagabhirava ......... | H10P 50/283 |
| 2020/0006080 A1* | 1/2020 | Osawa .............. | H01J 37/32082 |
| 2023/0360925 A1 | 11/2023 | Lin | |
| 2023/0377849 A1 | 11/2023 | Sridhar et al. | |
| 2024/0162042 A1* | 5/2024 | Guo ...................... | H10P 50/244 |
| 2024/0249927 A1* | 7/2024 | Park .................... | H01J 37/3473 |
| 2025/0188600 A1* | 6/2025 | Hudson ................. | C23C 16/045 |

OTHER PUBLICATIONS

Lutker-Lee, Katie et al., "Direct Current Superposition (DCS) for Protection of Organic Mandrel During Spacer Deposition," U.S. Appl. No. 18/433,320, filed Feb. 5, 2024.

* cited by examiner

*Primary Examiner* — Binh X Tran  
(74) *Attorney, Agent, or Firm* — Slater Matsil, LLP

(57) ABSTRACT

A method for fabricating a semiconductor device, where the method includes loading a substrate into a plasma chamber, the substrate including a patterned mask layer with an opening exposing a layer-to-be-patterned; and performing a number of cycles of a first plasma etch process, the first plasma etch process including: a first deposition step to conformally deposit a layer including an organic material including a fluorocarbon over the substrate, a deposition-etch step to sputter deposit a target material from a target electrode of the plasma chamber and extend the opening into the layer-to-be-patterned using an anisotropic self-limiting plasma etch process, and a first flush step to remove remaining organic material.

20 Claims, 12 Drawing Sheets

METHOD FOR ETCHING A LAYER THROUGH A PATTERNED MASK LAYER

TECHNICAL FIELD

The present invention relates generally to a method for patterning a layer, and, in particular embodiments, to a method for etching a layer through a patterned mask layer.

BACKGROUND

Fabricating a semiconductor integrated circuit (IC) comprises integrating a network of electronic components in a monolithic structure by sequentially forming and patterning layers of diverse materials in a semiconductor substrate. The monolithic structure integrates circuit elements, such as transistors and capacitors, as well as interconnect elements, such as wires, contacts, and vias. Enabled by advances in patterning technology, a component packing density is doubled about every two years in order to reduce unit cost, and, at the same time, enhance speed and functionality of ICs at each new technology node. The density doubling, achieved by three dimensional (3D) scaling and shrinking feature sizes, leads to a scenario that requires fabricating structures that have nanoscale footprints and high aspect ratios. An insatiable demand for miniaturization challenges patterning technology to print feature sizes approaching ten nanometers and etch high aspect ratio structures in a high volume IC manufacturing environment. Since plasma etching is widely used to form these structures, plasma technology is challenged to provide processes that enable patterning etched features having sidewall profiles and critical dimensions (CDs) controlled to almost atomic scale precision and accuracy. To meet this challenge, further innovations in plasma etch methods for CD and sidewall profile control are desired.

SUMMARY

A method for fabricating a semiconductor device, where the method includes loading a substrate into a plasma chamber, the substrate including a patterned mask layer with an opening exposing a layer-to-be-patterned; and performing a number of cycles of a first plasma etch process, the first plasma etch process including: a first deposition step to conformally deposit a layer including an organic material including a fluorocarbon over the substrate, a deposition-etch step to sputter deposit a target material from a target electrode of the plasma chamber and extend the opening into the layer-to-be-patterned using an anisotropic self-limiting plasma etch process, and a first flush step to remove remaining organic material.

A method for fabricating a semiconductor device, where the method includes loading a substrate over a bottom electrode of a plasma chamber, the substrate including a patterned mask layer with an opening exposing a layer-to-be-patterned; and performing a first plasma etch process, the first plasma etch process including: exposing the substrate to a first plasma generated in the plasma chamber from a first gas including a fluorocarbon and a first inert gas, the first plasma being generated using a first radio frequency (RF) bias power and a first RF source power, after the exposing, generating a second plasma over the substrate from a second inert gas and coupling a first direct current (DC) bias to a target electrode disposed within the plasma chamber, the first DC bias being negative relative to the bottom electrode, the second plasma being generated using a second RF bias power and a second RF source power, and exposing the substrate to a third plasma configured to remove exposed organic material, the third plasma being generated in the plasma chamber using a third RF bias power and a third RF source power.

A method for fabricating a semiconductor device, where the method includes having, within a plasma chamber, an upper electrode and a lower electrode, where a surface of the upper electrode facing the lower electrode includes a target material; loading a substrate over the lower electrode, the substrate including an etch mask having a pattern of openings, a bottom of the openings exposing a layer-to-be-patterned; performing a first plasma etch process, the first plasma etch process being a cyclic process, each cycle of the cyclic process including a sequence of plasma process steps, the sequence including: a deposition step, where a conformal layer of organic material including a fluorocarbon is coated over the substrate; a deposition-etch step to selectively etch the layer-to-be-patterned at the bottom of the openings using an anisotropic self-limiting plasma etch and, concurrently, sputter the target material over the substrate by biasing the upper electrode to a first DC bias, the sputtering forming an etch-resistant lining including the target material, where the deposition-etch step is configured to form the lining over the etch mask and sidewalls of the openings while exposing the bottom of the openings; and a flush step to remove remaining organic material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
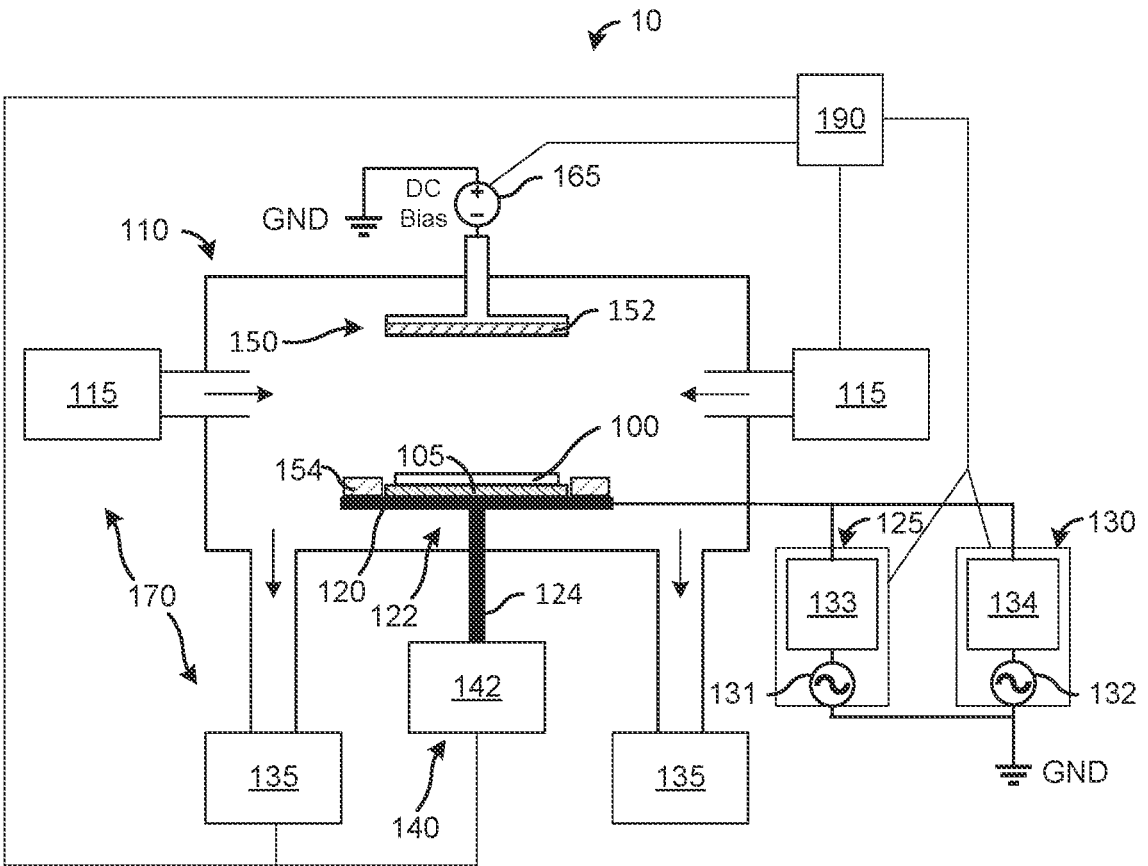
FIG. 1 illustrates a schematic of a plasma processing system configured to perform a plasma etch process, in accordance with some embodiments.

This application relates generally to a method for patterning a layer of a substrate, where the layer-to-be-patterned may be used to fabricate a semiconductor device. The particular embodiments in this disclosure are related to a method for etching features in the layer-to-be-patterned through a patterned mask layer. The substrate is provided with the mask layer comprising an initial pattern of openings already formed over the layer-to-be-patterned. The initial pattern of openings extend through the patterned mask layer to expose a surface of the layer-to-be-patterned. In the embodiments of the method described in this disclosure, a plasma etch process is performed to anisotropically extend the openings into the layer-to-be-patterned along a depth direction using plasma processing techniques. Typically, the etched features are patterned to have a cross-section shaped like a circle or a rectangle, often with a target feature size equal to a minimum size allowed for the pattern. The initial surface of the layer-to-be-patterned may be used as a reference plane to define geometric dimensions of the opening, for example, width, length, and depth dimensions. For specificity, the reference plane is defined as a horizontal plane, coincident with a top surface of the layer-to-be-patterned. Accordingly, the depth direction is a vertical direction.

Each of the openings has a depth dimension, defined as a vertical distance from the reference plane. The depth dimension at a bottom of the opening is referred to as a depth of the opening. In some embodiments, each opening is extended through the layer-to-be-patterned, exposing an underlying layer of the substrate when the plasma etch process is terminated. Here, at the end of the plasma etch process, the opening is considered to have a depth equal to a thickness of the layer-to-be-patterned. In some other embodiments, the plasma etch process may be terminated earlier in the layer-to-be-patterned, such that the openings may be extended to a desired depth less than the thickness of the layer-to-be-patterned.

In addition to a depth dimension, each opening has a width dimension and a sidewall profile. The width dimension is a horizontal distance between opposing sidewalls of the opening. For example, the width dimension of a circular opening is along a diameter of the circle, and the width dimension of a rectangular opening is along the shorter of the two sides of the rectangle. The width dimension in the reference plane is referred to as a width of the opening, and a ratio of the depth to the width is referred to as an aspect ratio of the opening. The width of a minimum size opening in the pattern is often referred to as a critical dimension (CD).

The sidewall profile represents a variation of the width dimension along the depth direction. It is generally desirable to etch openings having smooth, vertical sidewalls without bowing, bulges, or notches. The width may also fluctuate, i.e., vary randomly along a perimeter of the opening, for example, a circumference of circular openings or a length of rectangular openings. The width fluctuation, which occurs over a distance short compared to the feature size, is an undesirable phenomenon, commonly referred to as local CD uniformity (LCDU) or linewidth roughness (LWR). Variability of patterned dimensions often cause variations in electrical characteristics, which reduces manufacturing yield.

While a portion of the variability in the widths and sidewall profiles of the etched openings in the layer-to-be-patterned may be traced to the initial pattern of openings in the patterned mask, a significant portion of the variability may be attributed to the plasma etch process that extends the openings into the layer-to-be-patterned. For example, during ion-assisted reactive ion etching (RIE), vertically directed energetic ions may damage the opening in the mask layer as they strike the edges of the opening, resulting in an enlarged width and increased LWR. Furthermore, as the opening gets extended by the plasma etch process into the layer-to-be-patterned, the profile of the extended sidewalls may form undesired bowing, bulges, and notches, depending on an anisotropy and effectiveness of sidewall passivation. Typically, the electrical impact of variations of the width and the sidewall profile from the target CD and the ideal smooth, vertical sidewall profile increases for decreasing width and increasing aspect ratio. Thus, during volume manufacturing, stringent control of CD and sidewall profile is desired for high yield.

In the embodiments described in this disclosure, the plasma etch process comprises a first plasma etch process that extends the opening to a first depth, followed by a second plasma etch process that completes etching the opening, as described in detail further below. During the first plasma etch process a lining is formed on the sidewalls and a top surface of the mask layer while the bottom of the opening is left exposed. The subsequent second plasma etch process extends the opening deeper. However, the second plasma etch process differs from the first plasma etch process, such that no further lining may be formed. Materials and process parameters are selected for the lining (formed during the first plasma etch process) to be sufficiently resistant to etching to remain on the sidewalls and the top surface of the mask layer with a well-controlled thickness at the end of the second plasma etch process, despite exposure to various plasma environments. The lining serves several purposes. First, the lining serves to protect the mask layer and the sidewalls from being damaged by ions accelerating toward the substrate. This helps mitigate the undesired width enlargement and increased LWR, described above. Furthermore, the lining serves to reduce the width of each opening by about two times the thickness of the lining. This helps reduce the final width of the opening where a desired minimum width opening is difficult to achieve otherwise. Note that the width reduction may be controlled by controlling the thickness of the lining. Thus, using the embodiments for etching a pattern of openings in the layer-to-be-patterned through the patterned mask layer provides a dual advantage of reducing random width variations (by protecting the etch mask from plasma damage) and controllably adjusting the CD of the pattern (by controlling the thickness of the lining).

In the embodiments described in this disclosure, the first plasma etch process is a cyclic process comprising a sequence of three plasma process steps in each cycle, viz., a deposition step, a deposition-etch step, and a flush step.

At the beginning of each cycle, the deposition step deposits a layer comprising etchants covering the substrate, for example, an organic layer comprising fluorocarbon compounds. The etchants in the deposited layer do not react chemically with the portion of the layer-to-be-patterned exposed to etchants at the bottom of each opening until a surface region of this portion of the layer-to-be-patterned is activated by, for example, energetic ions bombarding the surface of the substrate during a plasma activation step performed after the deposition step.

In various embodiments, the plasma activation step is the deposition-etch step of the three step cyclic etch process. In this step, the plasma activates the surface region of the portion of the layer-to-be-patterned exposed to etchants to chemically react with the etchants and, concurrently, forms the lining. The lining is formed during the deposition-etch step by sputter depositing a target material utilizing, for example, a plasma processing function, commonly referred to as direct current superposition (DCS). In the DCS function, the target material is sputtered off a target electrode in a plasma chamber onto the substrate. The target electrode may be in an upper portion of the plasma chamber (a top electrode) while the substrate is in an opposite side of the plasma chamber over a substrate holder. In various embodiments, the substrate and the substrate holder are coupled to a bottom electrode, as described below. During the sputtering, a capacitively coupled plasma (CCP) is sustained in the space between the target electrode (the top electrode) and the substrate holder (the bottom electrode). The target electrode may be biased negatively to attract positively charged ions from the plasma to impinge on the target electrode, thus sputtering the target material onto various exposed surfaces, including the substrate and the walls of the plasma chamber.

At the opposite side of the plasma (opposite the target electrode), a major surface of the substrate facing the target electrode is exposed to the plasma. Thus, the plasma of the deposition-etch step, as described in further detail below, not only provides a flux of ions that sputters target material off the target electrode, but also provides a flux of ions toward the substrate (coupled to the bottom electrode) to selectively activate the surface region of the layer-to-be-patterned at the bottom of the opening, thus making the surface region there highly reactive to etchants, as explained in detail further below. The layer formed during the preceding deposition step comprises etchants. These etchants then selectively etches the bottom of the opening to recess the bottom further into the layer-to-be-patterned. Note that this ion-assisted etching process is selective, anisotropic, and self-limiting. The self-limiting aspect of the etching process is attributable to there being a finite amount of etchants available, the amount depending on the composition and thickness of the layer comprising etchants that was deposited during the deposition step performed earlier.

The flush step is performed after completing the deposition-etch step to prepare the plasma chamber and the substrate for the next cycle. The plasma process for the flush step is configured to remove remaining organic material from the substrate as well as the walls of the plasma chamber.

FIG. 1 illustrates a schematic of a plasma system 10 configured to perform a plasma etch process that may be a suitable example embodiment of the method for etching a pattern of openings in a layer-to-be-patterned through a patterned mask layer, as discussed above.

As illustrated in FIG. 1, the plasma system 10 comprises a plasma chamber 110 in a CCP configuration. As explained in further detail below, the plasma chamber 110 is equipped to execute plasma processes utilizing the DCS function.

In various embodiments, a substrate holder 105 is disposed in the plasma chamber 110. The substrate holder 105 may be configured to hold a substrate (e.g., substrate 100 in FIG. 1) having a major surface facing the inside of the plasma chamber 110. In some embodiments, the substrate holder 105 is a part of a pedestal 122 disposed in a bottom portion of the plasma chamber 110, as illustrated in FIG. 1. In some other embodiments, the pedestal 122 is also the substrate holder 105. In various embodiments, the pedestal 122 may be connected to a support column 124 that extends out of the plasma chamber 110. Electrical wires, gas flow lines, and coolant pipes may be passing through the support column 124 to couple parts of the pedestal 122 to various other components of the plasma system 10 disposed outside the chamber 110. In some embodiments, the substrate holder 105 is an electrostatic chuck (ESC) comprising ESC electrodes proximate below the surface of the substrate holder 105 on which the substrate 100 may be held. Typically, the top portion of the substrate holder 105 comprises an insulator. In some embodiments, the insulator may have a conductive coating.

In various embodiments, the plasma system 10 may comprise a temperature control system 140 configured to maintain a backside of the substrate 100 at a controlled temperature. Parts of the temperature control system 140 used for sensing and adjusting the temperature may be included in the pedestal 122. For example, the pedestal 122 may comprise a temperature sensor, such as a thermocouple or a thermistor configured to sense the temperature of the substrate 100. Furthermore, the pedestal 122 may have liquid coolant channels and resistive heating elements disposed below the surface of the substrate holder 105. In some embodiments, a pipe for carrying cooling gas to grooves in the surface of the substrate holder 105 that contacts the backside of the substrate 100 may be passed through the pedestal 122 (e.g., via the support column 124). Other parts of the temperature control system 140 may be disposed outside the plasma chamber 110. These parts are shown schematically as components 142 in FIG. 1 and may include, for example, a reservoir for liquid coolant, gas canisters, pumps, valves, pipes, additional sensors to sense, for example, temperatures and flow rates of the cooling fluids, and a temperature controller that receives data from the sensors and transmits control signals to operate various parts of the temperature control system 140. The components 142 may be coupled to parts of the temperature control system 140 included in the pedestal 122 via, for example, the support column 124, as illustrated in FIG. 1.

In various embodiments, the pedestal (e.g., pedestal 122) may comprise an electrode, referred to as bottom electrode or lower electrode, which may be configured to couple to various RF, DC, pulsed RF, and pulsed DC power supplies. In the example embodiment in FIG. 1, the pedestal 122 comprises a bottom electrode 120 disposed below the substrate holder 105. In some other embodiment, the bottom electrode may be within the substrate holder 105. In the example embodiment, the bottom electrode 120 is coupled to two RF power supplies, a first RF power supply 125 and a second RF power supply 130, as shown schematically in FIG. 1. It is noted that, typically, more than one power supply is used during plasma processing to provide flexibility in adjusting multiple plasma properties such as plasma density, ionization rate, dissociation rate, and a voltage across a plasma sheath, which determines a vertical velocity of an ion as it strikes the substrate. In some embodiments, the bottom electrode 120 may be coupled to one power supply (as opposed to multiple power supplies). The power supply may be an RF power supply or a different power supply, for example, a pulsed DC power supply. In some embodiment, the bottom electrode 120 may be coupled to a reference potential, referred to as ground. In some embodiment, the bottom electrode 120 may be floating.

In various embodiments, in addition to the bottom electrode 120, the plasma system 10 is equipped with an upper electrode, referred to here as target electrode 150. As illustrated in FIG. 1, the target electrode 150 is disposed inside the plasma chamber 110, above the bottom electrode 120. A lower portion of the target electrode 150, facing the substrate 100 on the substrate holder 105, is a sputter target 152 comprising a target material. The sputter target 152 may be detachably attached to an upper portion of the target electrode 150.

As mentioned above, the final width of the opening may be adjusted by controlling the thickness of the lining, which is formed by performing the deposition-etch step. The thickness of the lining increases with increasing number of cycles of the first plasma etch process. Hence, the final width may be adjusted by controlling the number of cycles of the cyclic first plasma etch process. In the example embodiment in FIG. 1, the deposition-etch step may be performed by applying the DCS function. The DCS function may be applied using the plasma system 10 to sputter deposit target material off the sputter target 152 onto the substrate 100, with plasma sustained between the target electrode 150 and the bottom electrode 120.

In various embodiments, in order to apply the DCS function, the target electrode 150 is configured to be coupled to a DC bias power supply 165, as illustrated in FIG. 1. During performing the deposition-etch step, the DC bias power supply 165 may apply a first DC bias to the target electrode 150, where the first DC bias biases the target electrode 150 negative relative to the bottom electrode 120. With the target electrode 150 biased negatively, positively charged ions are attracted from the plasma sustained between the target electrode 150 and the bottom electrode 120 and strike the sputter target 152 with high kinetic energy. The ion bombardment may sputter target material off the sputter target 152. The sputtered target material may deposit on the substrate 100, which is held by the substrate holder 105 below the sputter target 152, as well as on the wall of the plasma chamber 110.

In some embodiments, the target electrode 150 may be coupled to an RF power supply, in addition to the DC bias power supply 165. For example, instead of coupling the first RF power supply 125 and the second RF power supply 130 to the bottom electrode 120 (as seen in FIG. 1), in some embodiment, the first RF power supply 125 may be coupled to the target electrode 150 while the second RF power supply 130 remains coupled to the bottom electrode 120. In this configuration, the first DC bias is superposed on the RF signal from the first RF power supply 125.

Note that, the deposition-etch step is engineered to result in concurrent deposition and etching at different regions of the major surface of the substrate 100. The lining forms over the flat top portion and sidewalls while, at the same time, the bottom of each opening is etched. Since, the major surface of the substrate 100 and the exposed surface of the sputter target 152 are on opposite sides of the plasma used for the sputtering, the plasma may be double used to concurrently etch the layer-to-be-patterned at the bottom of each opening by configuring the plasma to provide a flux of ions to the substrate 100 that may selectively activate the layer-to-be-patterned at the bottom of each opening for etching to occur there.

As known to persons skilled in the art, low temperature gas discharge plasma for processing the substrate 100 may be generated at a low pressure in the plasma chamber 110 by ionizing gas flowing through the plasma chamber 110 using, for example, RF power (referred to as RF source power) supplied by an RF power supply, such as the first RF power supply 125. Additional RF power (referred to as RF bias power) supplied by another RF power supply, such as the second RF power supply 130, may be used to adjust, for example, an angle distribution of ions incident on the substrate 100. In the example plasma system 10 in FIG. 1, both RF power supplies are coupled to the bottom electrode 120. However, as mentioned above, various configurations may be used. For example, in some embodiment, the first RF power supply 125 may be coupled to the target electrode 150 while the second RF power supply 130 remains coupled to the bottom electrode 120.

The plasma system 10 comprises a gas flow system 170 to establish a gas flow through the plasma chamber 110. As illustrated schematically in FIG. 1, the gas flow system 170 may include a gas delivery system 115 to supply gas to the plasma chamber 110, and a gas evacuation system 135 to remove gas from the plasma chamber 110 and maintain a desired low pressure, as instructed by a process recipe. In various embodiments, components of the gas delivery system 115 and the gas evacuation system 135 may include gas canisters, flow meters, throttle valves, one or more vacuum pumps (e.g., a mechanical roughing pump combined with one or more turbomolecular pumps) etc. The plasma chamber 110 may be configured with multiple gas inlets and outlets to achieve a uniform gas flow over the substrate 100.

In the embodiments of the method for etching the layer-to-be-patterned through the patterned mask layer, there are various parameters that influence the plasma processing of the substrate 100, i.e., influence the physical and chemical interactions between the various regions of the major surface of the substrate 100 (e.g., the top surface, the bottom of each opening, and the sidewalls), and a flux of particles (e.g., radicals and ions) from the plasma incident on the major surface of the substrate 100. Clearly, the materials exposed to the plasma are parameters of interest. These may include the materials of the mask layer, the layer-to-be-patterned, the underlying layer, the target material, and the deposited lining. In addition, there are parameters of interest related to plasma generation and processing. These may include the chemical composition of the incident flux, ion to radical ratio, ion energy and ion angle distribution, and plasma density.

Some of the parameters related to the plasma generation and processing depend on the electrical signals coupled to the bottom electrode 120 and the target electrode 150 during the processing. As mentioned above, having more than one power supply provides flexibility in adjusting the plasma properties. Typically, a higher frequency RF signal (e.g., about 60 MHz to about 4 GHz), referred to as RF source power, and a lower frequency RF signal (e.g., between 100 kHz and about 40 MHz), referred to as RF bias power, are applied. In various embodiments, RF source power is coupled to plasma in the plasma chamber 110 to ignite and sustain the plasma. Generally, a high frequency RF signal is used to adjust plasma properties such as plasma density, ionization rate, and dissociation rate, and a low frequency RF signal is used to control the flux the kinetic energy of ions striking the substrate. The RF bias power is coupled to plasma in the plasma chamber 110 to control the vertical velocity of ions striking the substrate 100. It is noted that, in some embodiments (including the example plasma system 10 in FIG. 1), the bias power is provided as a continuous wave RF (CW-RF) signal while, in some other embodiments, bias power may be provided, for example, as a pulsed RF signal, a pulsed DC signal, or a DC signal.

For the sake of specificity, in the embodiment illustrated in FIG. 1, the RF source power may be provided by the first RF power supply 125 and the RF bias power may be provided by the second RF power supply 130. Although, in this example, both RF source power and RF bias power are coupled to the bottom electrode 120, it is understood that various combinations are possible. For example, in some embodiment, the RF source power may be coupled to the target electrode 150 while the RF bias power is coupled to the bottom electrode 120.

As illustrated schematically in FIG. 1, the first RF power supply 125 may comprise a tunable RF power source 131 with its output coupled to an impedance matching circuit 133 to suppress reflections and transfer power efficiently to the plasma at an operating RF frequency. In the example embodiment in FIG. 1, the first RF power supply 125 outputs a continuous wave RF (CW-RF) signal. In some other embodiments, the first RF power supply 125 may further include a pulse generator and a chopper circuit to output a pulsed RF signal.

The second RF power supply 130 is similar to the first RF power supply 125. In the example embodiment in FIG. 1, the second RF power supply 130 comprises a tunable RF power source 132 with its output coupled to an impedance matching circuit 134. In some other embodiments, the second RF power supply 130 may also include additional circuitry to output a pulsed RF signal. In some embodiments, the second RF power supply 130 may be replaced with a pulsed DC power supply or a DC power supply.

As explained above, in various embodiments, the target electrode 150 comprises the sputter target 152, which may be used to sputter deposit target material when the deposition-etch step is performed. Thus, the target electrode 150 is configured to be coupled to the DC bias power supply 165.

In order to improve process yield, it is desirable to generate the plasma uniformly across the entire major surface of the substrate 100. However, along an edge of the substrate 100, electromagnetic (EM) properties (such as, conductivity, permittivity, and permeability) may change abruptly in a radial direction because of material discontinuity across a boundary between the substrate 100 and the substrate holder 105. The discontinuities may cause nonuniformity in radial components of the EM field in the vicinity of the edge. Hence, there may be a respective radial nonuniformity in plasma processing in an annular edge region of the substrate 100, resulting in an undesirably higher yield loss of the semiconductor devices fabricated in the edge region of the substrate 100. As known to persons skilled in the art, uniformity of the EM field may be extended radially beyond the edge by surrounding the substrate 100 with, for example, a dielectric ring (referred to as a focus ring) having, for example, a desired permittivity.

As illustrated in FIG. 1, in various embodiments, the plasma system 10 may comprise a focus ring 154 placed over the disc-shaped bottom electrode 120. The substrate 100 may be positioned centrally within the ring. Generally, dimensions of the focus ring 154, for example, a radial width and a vertical height above the substrate 100 may be optimized to maintain and extend the uniformity of the EM field to achieve uniform plasma processing in the edge region of the substrate 100. Typically, there may be a clearance of a few hundreds of microns to a few millimeters between the edge of the substrate 100 and the focus ring 154. In various embodiments, the focus ring 154 may comprise a silicon-based material (e.g., silicon, silicon oxide, and silicon carbide), a carbon-based material, or a metal oxide.

As illustrated schematically in FIG. 1, the plasma system 10 may further comprise a system controller 190 comprising, for example, a processor coupled to a memory device. During operation, the processor may import, from the memory device, instructions from a process recipe and feedback data from sensors in the plasma system 10 and execute the instructions. By executing the instructions, the system controller 190 may generate appropriate control signals for configuring and operating various components and sub-systems of the plasma system 10. As illustrated schematically in FIG. 1, the system controller 190 may be coupled to a communication network within the plasma system 10 to send the generated control signals synchronously to control the various components and sub-systems of the plasma system 10 for the plasma etch process comprising the first plasma etch process 230 and the second plasma etch process (box 240) to be executed properly. For example, the schematic in FIG. 1 shows the system controller 190 coupled to a communication network configured to transmit control signals to the gas delivery system 115, the gas evacuation system 135, the first RF power supply 125 and the second RF power supply 130, the temperature control system 140, and the DC bias power supply 165. Through this communication network, the system controller 190 may use the control signals to synchronously adjust relevant process parameters such as gas flow rates, pressure in the plasma chamber 110, frequencies and power levels of the RF source signal and the RF bias signal, temperature of the substrate 100, and the DC bias applied to the target electrode.

Figure 2:
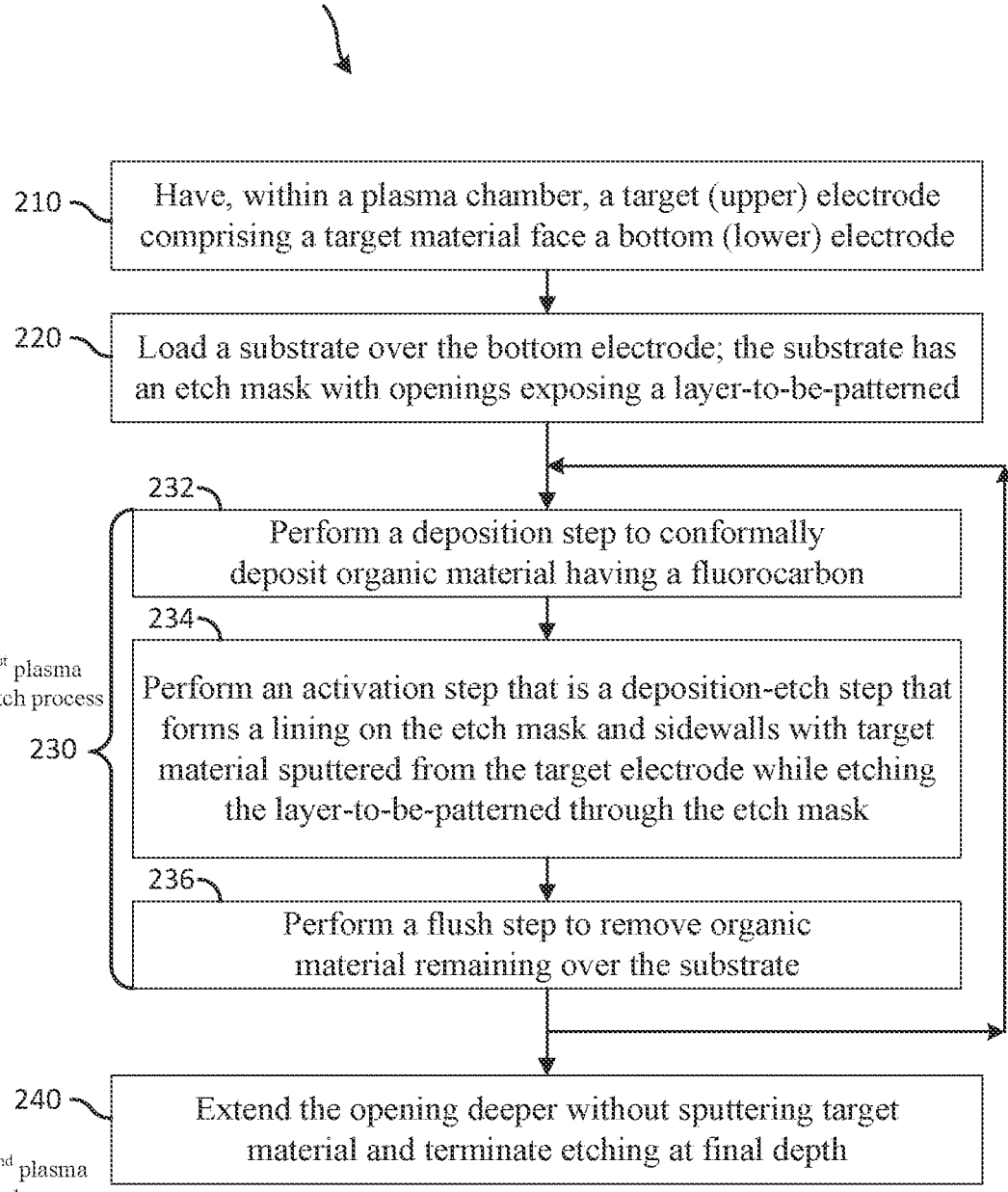
FIG. 2 illustrates a flowchart of a plasma etch process, in accordance with some embodiments.

FIG. 2 illustrates a flowchart outlining an example embodiment of the method 20 for etching features in the layer-to-be-patterned through the patterned mask layer. The method may be implemented in a semiconductor device fabrication flow comprising the plasma etch process, discussed above. The plasma etch process may be performed on the substrate 100 using the plasma system 10, as illustrated schematically in FIG. 1. Cross-sectional views of the semiconductor device in the substrate 100, at various intermediate stages of the processing, are illustrated in FIGS. 3A-3F.

The example embodiment of the method 20 is now described with reference to FIG. 1, FIG. 2, and FIGS. 3A-3F.

As indicated in box 210 in the flowchart illustrated in FIG. 2, the method 20 uses a plasma chamber, similar to the plasma chamber 110 in FIG. 1, where the target electrode 150 includes the sputter target 152 comprising the target material facing the bottom electrode 120. In various embodiments, the target material may be silicon.

As shown in FIG. 1 and indicated in box 220, the substrate 100 is loaded in the plasma chamber 110 and held on the substrate holder 105 over the bottom electrode 120. A major surface of the substrate 100 is facing toward the target electrode 150 inside of the plasma chamber 110. Box 220 of the method 20 further indicates that, prior to performing the plasma etch process, the substrate 100 has been pre-processed to have an etch mask formed and patterned over the layer-to-be-patterned.

Figure 3A:
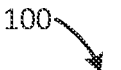
FIGS. 3A-3F illustrate cross-sectional views of a semiconductor device in a substrate at various intermediate stages of processing, as the substrate is processed using the plasma etch process illustrated in the flowchart in FIG. 2.
Figure 3A:
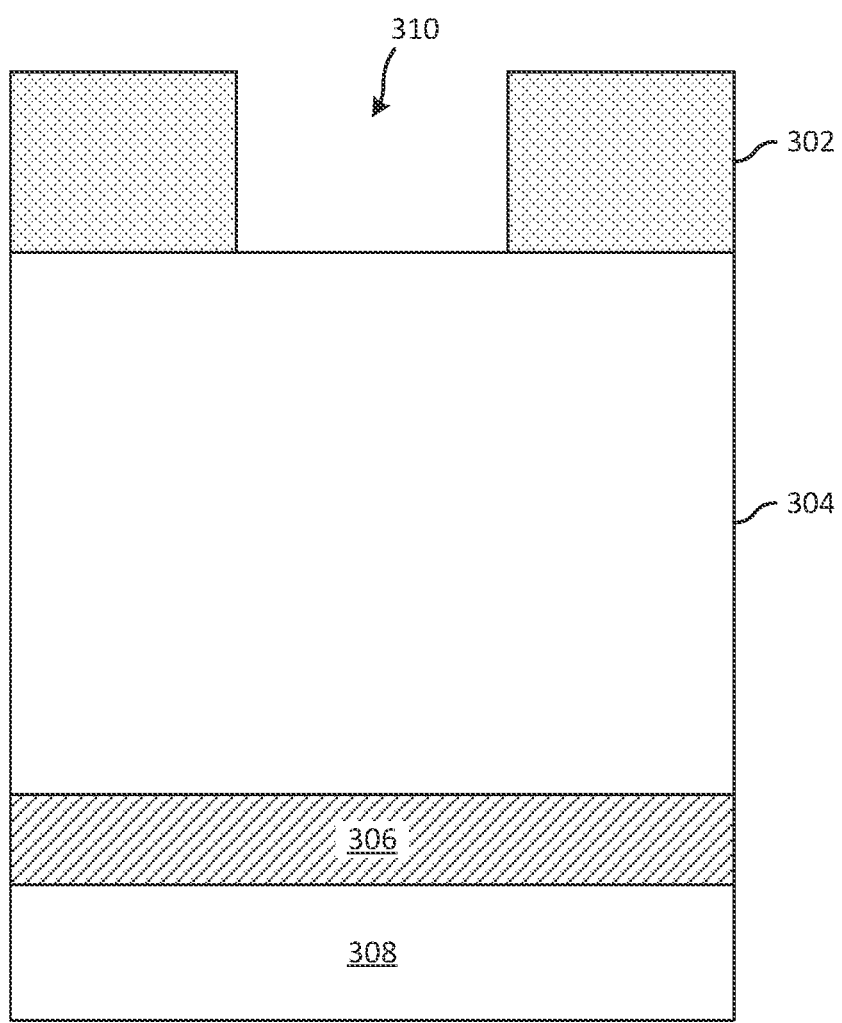

FIG. 3A illustrates a cross-sectional view of an example semiconductor device in a substrate 100 prepared for executing the method 20. In FIG. 3A, the substrate 100 comprises a patterned mask layer 302 formed over an unpatterned layer-to-be-patterned 304. An underlying layer 306 is shown below the layer-to-be-patterned 304. A base layer 308, disposed below the underlying layer 306, represents collectively all the other layers of the substrate 100 (including a starting substrate).

In general, the starting substrate is a semiconductor wafer. In various embodiments, one of a variety of semiconductor wafers may be used. In some embodiments, the starting substrate may be a bulk silicon wafer, a bulk germanium wafer, or comprise a silicon germanium wafer. In some embodiments, the starting substrate may be a compound semiconductor wafer, for example, a silicon carbide wafer, gallium arsenide wafer, gallium nitride wafer, and the like. In some embodiments, the starting substrate comprises heterogeneous layers such as silicon germanium on silicon, gallium nitride on silicon, silicon carbide on silicon, or silicon on insulator (SOI), as well silicon on silicon (e.g., a layer of silicon of one conductivity deposited epitaxially on a layer of silicon of a different conductivity).

In various embodiments, the starting substrate may have undergone a number of steps of processing at a number of patterning levels following, for example, an IC fabrication process flow. Accordingly, the base layer 308 of the substrate 100 may comprise semiconductors, dielectrics, and conductors in various patterned and unpatterned layers. In various embodiments, the layer-to-be-patterned 304 is formed over the base layer 308. In some embodiments, an additional etch stop layer may be deposited prior to forming the layer-to-be-patterned 304. As illustrated in FIG. 3A, the example embodiment includes the underlying layer 306 formed between the base layer 308 and the layer-to-be-patterned 304. The underlying layer 306 may comprise a material selected to serve as an etch stop for the plasma etch process of method 20. For example, in some embodiments, where the layer-to-be-patterned 304 comprises silicon oxide, the underlying layer 306 may comprise silicon nitride, carbon-doped SiN, Si, SiGe, or Ge.

As mentioned above, the pre-processing for preparing the substrate 100 includes forming the etch mask for the plasma etch process to etch the layer to be patterned 304. Accordingly, as illustrated in FIG. 3A, the patterned mask layer 302, comprising a suitable masking material, has been formed over the layer-to-be-patterned 304 and patterned using, for example, extreme ultraviolet (EUV) lithography. In the example embodiment, the patterned mask layer 302 may comprise a hardmask having a pattern of openings extending through the patterned mask layer 302. The bottom of each opening of this initial pattern of openings exposes a surface of the layer-to-be-patterned 304, such as the opening 310 illustrated in FIG. 3A. In various embodiments, the layer-to-be-patterned 304 may comprise silicon oxide, and the patterned mask layer 302 may comprise the patterned hardmask. In some embodiments, the patterned mask layer 302 may include a layer of a lithography mask used to pattern the hardmask, for example, a bottom antireflective coating (BARC). The hardmask material may be, for example, amorphous silicon, silicon nitride, titanium, titanium nitride, tungsten carbide, or the like, or a combination thereof.

After the substrate 100 has been loaded in the plasma chamber 110 and positioned on the substrate holder 105 over the bottom electrode 120, the plasma etch process of method 20 may be performed. As mentioned above, the plasma etch process of method 20 comprises the first plasma etch process 230 that extends the opening to the first depth, followed by the second plasma etch process (box 240) that completes etching the opening 310. Referring again to the flowchart of the method 20 in FIG. 2, the first plasma etch process 230 is the cyclic process (mentioned above), where each cycle comprises three plasma process steps performed sequentially. In some embodiments, the plasma process steps are performed in situ.

Figure 3B:
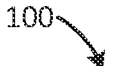
Figure 3B:
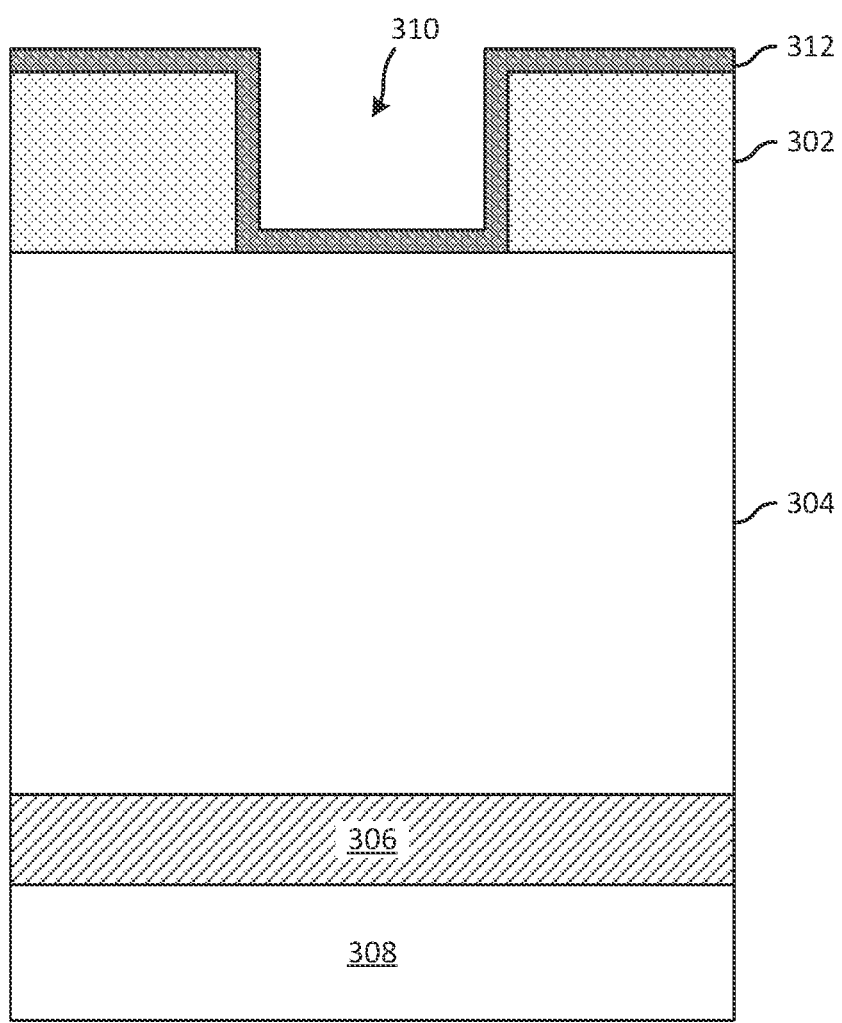

As indicated in box 232 in FIG. 2, a first step in the sequence of three steps is a deposition step that deposits organic material comprising fluorocarbons over the substrate 100, including the sidewall and bottom of the opening 310. FIG. 3B illustrates the substrate 100 after an organic layer 312 has been deposited. At the beginning of the first cycle of the cyclic first plasma etch process 230, there is no lining present. Hence, the organic material is deposited directly on a surface comprising an exposed portion of the layer-to-be-patterned 304 at the bottom of the opening 310, the sidewalls of the opening 310, and the top of the patterned mask layer 302. It is noted that an initial lining is formed during the first cycle of the first plasma etch process 230, as mentioned above. However, at the end of each cycle, the layer-to-be-patterned 304 is again exposed at the bottom of the opening 310, the lining being formed selectively on the sidewalls of the opening 310 and the top of the patterned mask layer 302, as explained in detail further below. Thus, in each cycle (subsequent to completing the first cycle), the organic material is deposited on the lining over the top and sidewalls of the patterned mask layer 302, but the organic material is always deposited directly on the exposed layer-to-be-patterned 304 at the bottom of the opening 310.

Hence, in each cycle a new organic layer 312 comprising fluorocarbons is formed during the deposition step (box 232) in contact with the layer-to-be-patterned 304 at the bottom of the opening 310. In the example embodiment described with reference to FIG. 1 and FIGS. 3A-3F, the fluorocarbon containing organic layer 312 may be a source of fluorine for etching the layer-to-be-patterned 304 in a subsequent step of each cycle of the first plasma etch process 230, as described further below.

The deposition step (box 232) is performed by exposing the substrate 100 to a first plasma generated in the plasma chamber 110 from a first gas. The first gas may comprise a fluorocarbon and a first inert gas. In various embodiments, the fluorocarbon in the first gas may comprise, for example, $CF_4$, $C_2F_6$, $C_3F_8$, $C_4F_6$, $C_4F_8$, $CHF_3$, $CH_3F$, or $CH_2F_2$, or a combination thereof. The first inert gas may be, for example, helium, neon, argon, or krypton. In some embodiment, the first gas comprises $C_4F_8$ flowing at a flow rate from 0.1 sccm to about 30 sccm and argon flowing at a flow rate from 30 sccm to about 1100 sccm. The plasma chamber 110 may be maintained at a low pressure, for example, from about 3 mTorr to about 50 mTorr.

The fluorocarbon gas may be a precursor activated by the first plasma to participate in chemical reactions that result in solid products, which may comprise organic molecules, including various fluorocarbons. In various embodiments, the composition of the solid material forming the organic layer 312 is developed from the dissociated products of fluorocarbon plasmas, which may comprise, for example, amorphous carbon (C—C), C—F, C—$F_2$, C—$F_3$, and their mixtures.

In various embodiments, the first plasma may be sustained by coupling RF source power in a range from about 100 W to about 2 kW at a frequency range from about 60 MHz to about 4 GHz. Since a conformal deposition is desired for the organic layer 312 to form uniformly over sidewalls as well as flat surfaces, it is undesirable to use a high RF bias. Accordingly, in various embodiments, an RF bias power in a range from about 0 W to about 100 W at a frequency of about 100 kHz to about 40 MHz may be coupled to the first plasma, where an RF bias power of 0 W implies that no RF bias is applied. In various embodiments, where an RF bias power is applied, the minimum value of the range of RF bias power may be about 5 W.

As described above, in the example plasma system 10, RF source power and RF bias power may be supplied by the first RF power supply 125 and the second RF power supply 130, as illustrated in FIG. 1. Since sputter deposition of target material is not desired during the deposition step referred to in box 232, the DC bias power supply 165 is not applied to the target electrode 150.

A second step in the sequence of three steps in the cycle is a plasma deposition-etch step (including a plasma activation step) performed after completing the first step, as indicated in box 234 of the first plasma etch process 230. The etching technique is a self-limiting ion-assisted etching technique (similar to RIE), and the deposition technique is a physical plasma deposition technique (similar to sputter deposition). The sputtering is performed concurrently with the etching by configuring the plasma chamber 110 to apply the DCS function (described above) using the target electrode 150 comprising the sputter target 152.

Figure 3C:
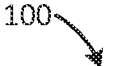
Figure 3C:
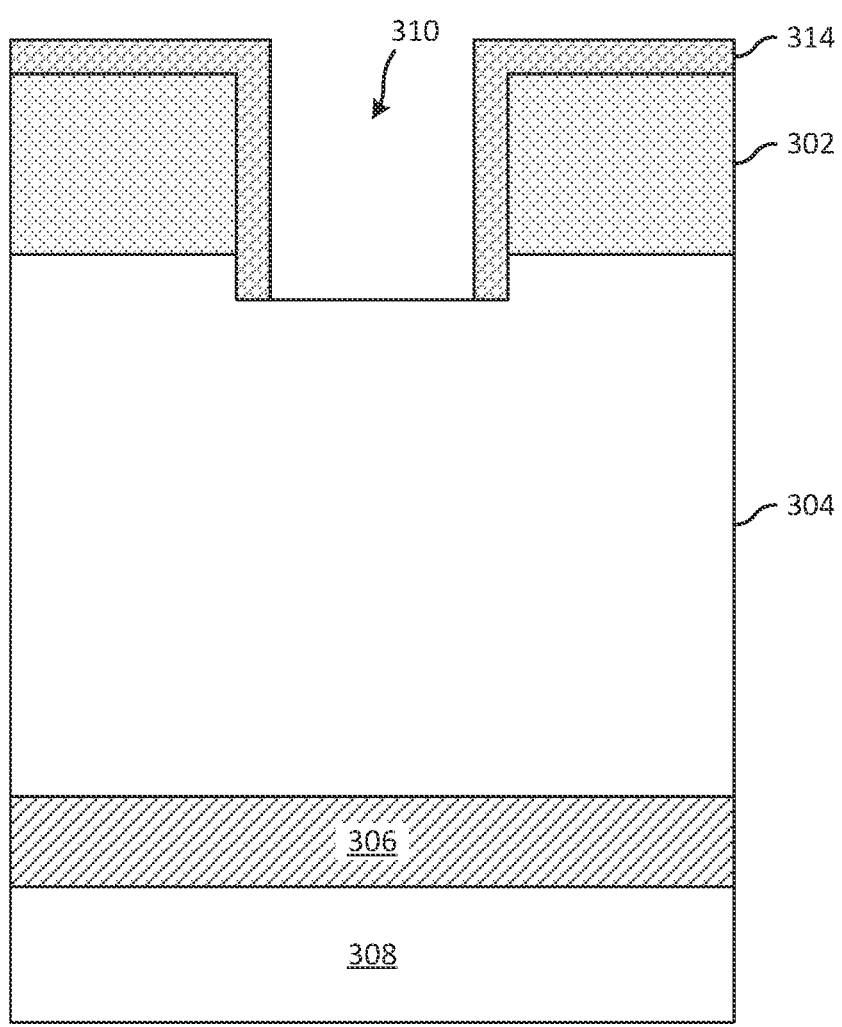

FIG. 3C illustrates a cross-sectional view of the substrate 100 after the deposition-etch step (box 234) has been completed in one cycle of the first plasma etch process 230. As seen in FIG. 3C, the opening 310 has been recessed vertically into the layer-to-be-patterned 304. Furthermore, the bottom of the opening 310 has been etched selective to the top surface and the sidewalls. The anisotropy of the etching may be attributed to the etching technique used in this step, where a vertically directed flux of ions incident on the substrate activates a surface region of the portion of the layer-to-be-patterned 304 at the bottom of each opening 310. Without the assistance of ions, the sidewalls do not etch laterally while the bottom is etched vertically. The plasma activation selectively increases chemical interaction between etchants and the surface region of the portion of the layer-to-be-patterned 304 at the bottom of the opening 310, hence increasing the etch rate there.

In addition to being anisotropic and selective, the etch process is self-limiting. Self-limiting etching may be achieved by ensuring that there is no flow of etchants into the plasma chamber 110 during the deposition-etch step (box 234). In this example embodiment, the etchants, for example, fluorine atoms, are obtained from the fluorocarbons in the organic layer 312 formed during the preceding deposition step (box 232). Only a finite amount of etchants are available, the amount being controlled by the composition and thickness of the organic layer 312. The supply of etchants, hence the etch rate, diminishes as the etchants react with the activated surface region of the portion of the layer-to-be-patterned 304 at the bottom of each opening 310 to form volatile byproducts that are pumped out of the plasma chamber 110.

Concurrent with material removal from the surface region of the portion of the layer-to-be-patterned 304 exposed to etchants at the bottom of the opening 310, material growth has occurred over the rest of the substrate 100 (i.e., the flat top surface and sidewalls of openings 310). As illustrated in FIG. 3C, the rest of the substrate 100 has been covered by an etch-resistant lining 314. As explained above with reference to FIG. 1, the etch-resistant lining 314 may be formed by configuring the deposition-etch step (box 234) to deposit target material by sputtering, using the sputter target 152 in the target electrode 150.

The deposition-etch step (box 234) may be performed in situ by coupling the first DC bias from the DC bias power supply 165 to the target electrode 150 and generating a second plasma in the plasma chamber 110 from a second inert gas. Since the gas used for generating a second plasma in the deposition-etch step (box 234) is an inert gas, all the reactants participating in the chemical reactions during the deposition-etch step (box 234) are already present in the plasma chamber 110; there is no chemically active species in the gaseous mixture introduced in the plasma chamber 110. In various embodiments, the second inert gas may be helium, neon, argon, or krypton. In some embodiments, the first inert gas and the second inert gas may be the same inert gas. In some embodiment, the second inert gas may be argon, and the flow rate of argon may be from about 30 sccm to about 1100 sccm. The pressure in the plasma chamber 110 may be maintained at about 3 mTorr to about 50 mTorr.

As explained above, the sputter deposition may be achieved during the deposition-etch step (box 234) by utilizing energetic ions, for example, positively charged argon ions, to strike the sputter target 152 comprising, for example, silicon. In order to attract and accelerate the positively charged ions, the first DC bias biases the target electrode 150 negative relative to the bottom electrode 120. In various embodiments, during the deposition-etch step (box 234), the first DC bias may be from about −100 V to about −1000 V.

In various embodiments, the second plasma may be sustained by RF source power in a range from about 100 W to about 2 kW at a frequency range from about 150 MHz to about 4 GHz. In various embodiments, the deposition-etch step (box 234) may be applying RF bias power in a range from about 10 W to about 2 kW at a frequency range from about 100 kHz to about 40 MHz.

The RF bias power in the deposition-etch step (box 234) may be increased relative to that for the deposition step (box 232) to accentuate anisotropy in the removal of material from the layer-to-be-patterned 304 and in the deposition of material on the etch-resistant lining 314. A higher RF bias power increases the vertical component of ion velocity in the ion flux incident on the substrate 100, thus providing a more vertical distribution of ion velocity for ions in the ion flux to the substrate 100. With the RF bias power applied, the ions (e.g., argon ions) in the ion flux striking the substrate 100 from the second plasma have an ion velocity distribution, where the velocities are almost entirely vertical. Such a distribution is desired for anisotropic plasma processing.

For specificity, we assume that, in the example embodiment in FIGS. 3A-3F, the patterned mask layer 302 comprises silicon nitride, the layer-to-be-patterned 304 comprises silicon dioxide, and the sputter deposited target material, incorporated in the etch-resistant lining 314, comprises silicon. The etch-resistant lining 314 may comprise a composite of silicon and fluorocarbons.

In the deposition-etch step (box 234) of this example embodiment of method 20, the sputter deposition process deposits the target material (silicon) to form the etch-resistant lining 314 selectively over the sidewalls of the opening 310 relative to the bottom of the opening 310. Concurrently, the ion-assisted plasma etching in the deposition-etch step (box 234) selectively etches the bottom of the opening 310 vertically to extend the vertical sidewalls and the horizontal bottom of the opening 310 further into the layer-to-be-patterned 304. The predominantly vertical orientation of the ion angle distribution promotes the selective deposition on the sidewalls and the selective etching of the bottom of the opening 310. Typically, silicon has low reactivity to fluorocarbons and, as expected, the sputtered silicon mixes with the fluorocarbons from the organic layer 312 to form the composite material in the etch-resistant lining 314. However, the energetic ions in the vertically directed ion flux bombarding the bottom of the opening 310 activates the silicon dioxide in the surface region of layer-to-be-patterned selectively to make the bottom of the opening 310 highly reactive. Chemical activity over the rest of the surface of the substrate 100 is relatively low during the deposition-etch step (box 234). The low chemical activity preserves the fluorocarbon and silicon deposits that form the etch-resistant liner 314 over the sidewalls and the patterned mask layer 302. In contrast, the layer-to-be-patterned 304 is exposed at the bottom of the opening 310 by the end of the deposition-etch step (box 234), as illustrated in FIG. 3C. The chemical reactions, described below, occurring selectively in the surface region at the bottom of the opening 310 explains the selectivity and anisotropy of the plasma processing during the deposition-etch step (box 234).

While the anisotropic activation is understood from the anisotropy in the ion angle distribution, the selective activation of the layer-to-be-patterned 304 at the bottom of the opening 310 relative to the top horizontal surface of the patterned mask layer 302 may be attributed to differences between the materials, i.e., differences between silicon nitride and silicon dioxide. The activation mechanism comprises energetic ions breaking relatively strong Si—O bonds in the layer-to-be-patterned 304, which comprises silicon dioxide ($SiO_2$). In the case of $SiO_2$, breaking the Si—O bonds releases oxygen atoms that chemically react with the fluorocarbons, producing volatile gases such as CO, $CO_2$, and $COF_2$. Removing carbon from the fluorocarbon deposits increases the supply of fluorine, which renders the bottom surface of the layer-to-be-patterned 304 to be highly reactive. In the absence of this mechanism, most of the fluorine in the fluorocarbon deposits over the top of the patterned mask layer 302 remain unreacted, and there is only a small loss of material by reaction with fluorine in the etch-resistant lining 314. Accordingly, the etch rate is selectively high for the silicon dioxide in the activated surface region of the layer-to-be-patterned relative to the silicon nitride of the patterned mask layer 302 and the protected silicon dioxide (i.e., not activated by ion bombardment) along sidewalls of a portion of the opening 310, which is in the layer-to-be-patterned 304.

As mentioned above, the etch rate slows down as the etching depletes the supply of etchants by consuming the material deposited over the bottom surface of the opening 310 with chemical reactions. By the end of the deposition-etch step (box 234), there is no material left covering the silicon dioxide the bottom surface of the opening 310, as illustrated in FIG. 3C.

The sputtered silicon arriving at the highly reactive surface at the bottom of the opening 310 interacts with the fluorine released from the fluorocarbon deposits (e.g., C—F, C—$F_2$, and C—$F_3$) deposited during the deposition step (box 232), as described above. This phenomenon, described as fluorine scavenging, increases a ratio of carbon to fluorine atoms participating in the chemical reactions used to remove silicon dioxide from the layer-to-be-patterned 304. Thus, the DCS function may be used to tailor the etching of silicon dioxide in the layer-to-be-patterned 304, in addition to forming the etch-resistant liner 314 to adjust the final width of the opening 310 and protect the patterned mask layer 302. The impact of the DCS function on the profile of the opening 310 is discussed further below with reference to FIGS. 4A-4C.

As indicated in box 236 of the method 20 in the flowchart illustrated in FIG. 2, after completing the deposition-etch step (box 234), the third and last plasma process step of each cycle of the first plasma etch process 230 may be performed. The third plasma process step is the flush step (box 236) to remove remaining organic material from the surface of the substrate 100 and the wall of the chamber 110. Removing the organic material deposited on the chamber wall restores the plasma chamber 110 and eliminates a possibility of defects caused by fluorine-containing organic material falling on the substrate and activating an undesired chemical reaction.

In the flush step (box 236), the substrate 100 may be exposed in situ to a third plasma generated in the plasma chamber 110. In some embodiments, the third plasma is generated from a gas comprising oxygen and some inert gas (e.g., krypton, helium, neon, or argon). During the processing, oxygen radicals may react with organic material to produce volatile gases such as CO, $CO_2$, and $COF_2$ which are removed by the gas flow in the plasma chamber 110. In some embodiment, the gas for the third plasma comprises oxygen flowing at a flow rate from 1 sccm to about 1500 sccm and argon flowing at a flow rate from 30 sccm to about 1100 sccm. The plasma chamber 110 may be maintained at a low pressure, for example, from about 3 mTorr to about 250 mTorr.

In some other embodiments, the third plasma may be generated from a gas comprising nitrogen and hydrogen. Plasma generated by ionizing the gaseous mixture comprising nitrogen and hydrogen comprise atomic hydrogen, atomic nitrogen, and their mixture radicals, such as $NH_2$*, $NH_3$*, $NH_4$*, and $N_2H$*, in the plasma chamber 110. These radicals spontaneously react with carbon-containing films and facilitate desorption of remaining organic material from the surface of the substrate 100 and the wall of the plasma chamber 110.

Figure 3D:
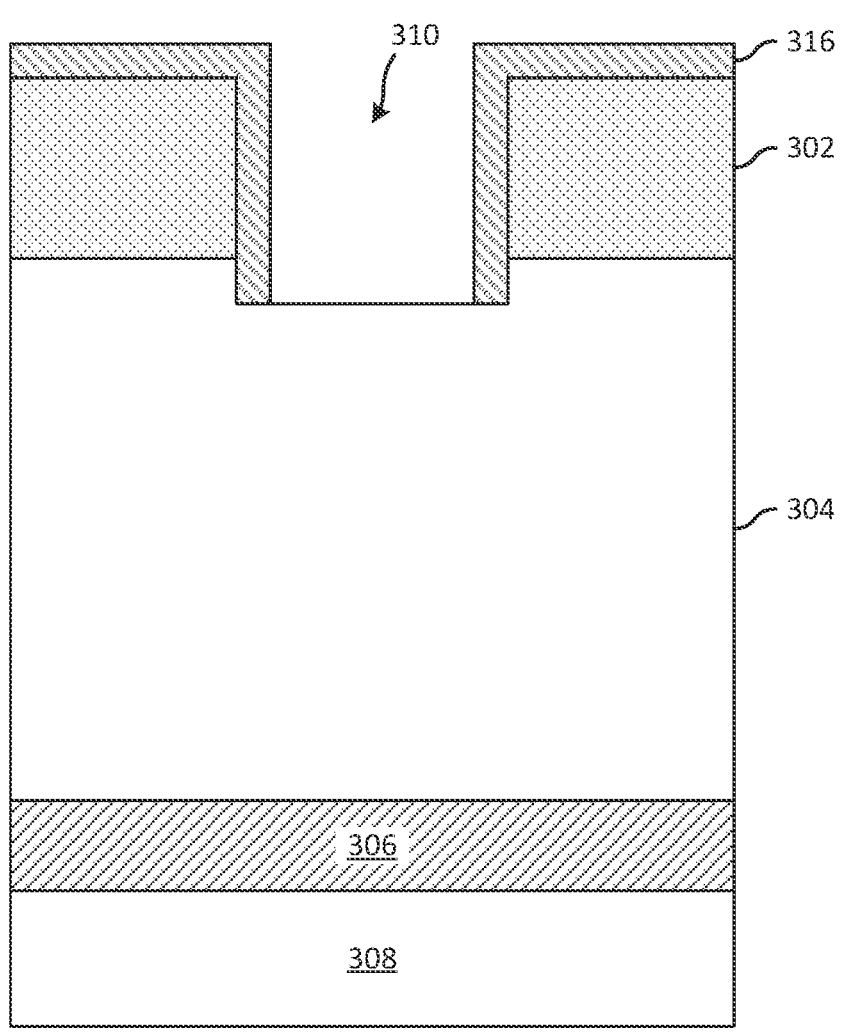

FIG. 3D illustrates the substrate 100 after the flush step (box 236) is completed. As mentioned above, flushing out the organic material from the exposed surfaces of the substrate 100 and the plasma chamber 110 with the third plasma prevents, for example, accidental peeling of organic material from the walls of the plasma chamber 110, resulting in unwanted chemical reactions and process defects. In various embodiments, the exposure to the third plasma may alter the composition of the etch-resistant lining 314 in FIG. 3C to be richer in silicon, thus forming a modified lining 316, as illustrated in FIG. 3D.

In various embodiments, the third plasma may be sustained by coupling RF source power in a range from about 100 W to about 2 kW at a frequency range from about 60 MHz to about 4 GHz. Since the third plasma is intended for removing remaining organic material from the surface of the substrate as well as from the wall of the chamber 110, it is undesirable to use a high RF bias. Accordingly, in various embodiments, an RF bias power in a range from about 0 W to about 2 kW at a frequency range from about 100 kHz to about 40 MHz may be coupled to the third plasma. In some embodiment, the RF bias power may be from about 0 W to about 500 W. An RF bias power of 0 W implies that no RF bias is applied. In various embodiments, where an RF bias power is applied, the minimum value of the range of RF bias power may be about 5 W.

Figure 3E:
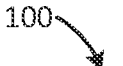
Figure 3E:
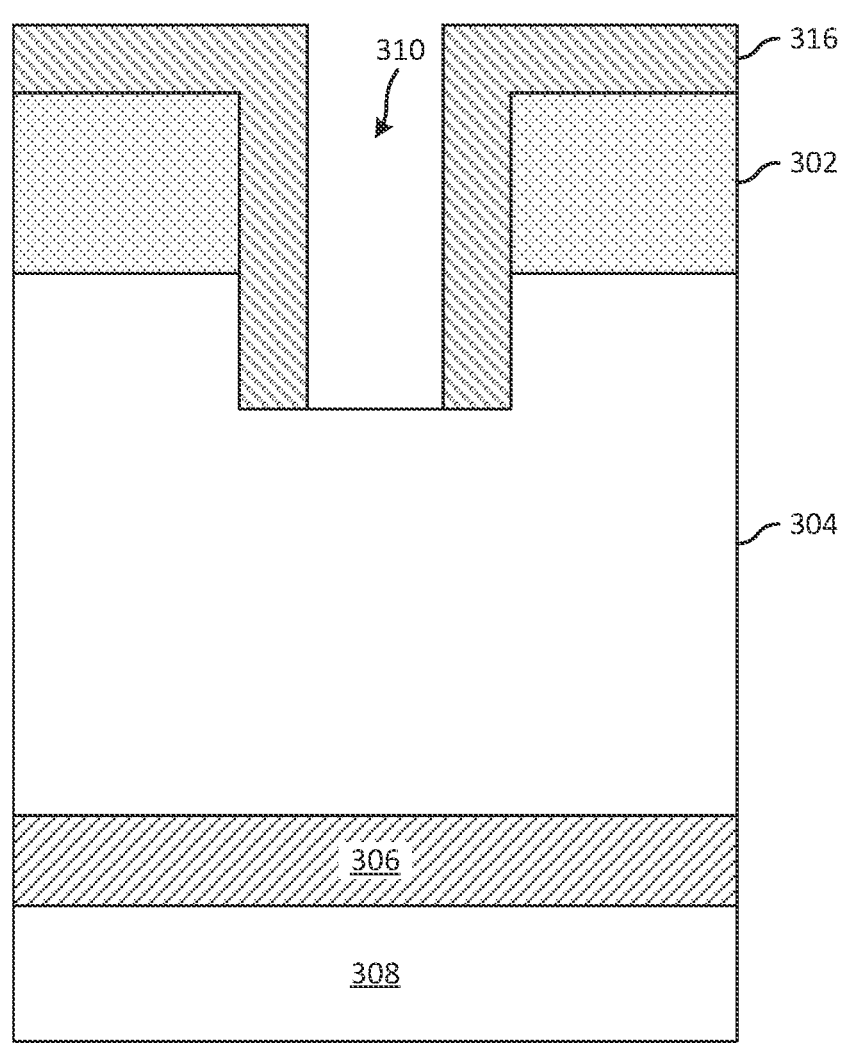

The substrate 100 may be processed through a number of cycles of a first plasma etch process 230. A thickness of the modified lining 316 formed on sidewalls of the opening 310 increases with increasing number of cycles of the first plasma etch process 230, which implies that the width of the opening 310 decreases with increasing number of cycles. The number of cycles may be selected to obtain a desired decrease in width. FIG. 3E illustrates the substrate 110, after the desired width reduction has been attained for the opening 310. The first plasma etch process 230 may be terminated after completing the selected number of cycles.

As indicated in box 240 of the method 20 in FIG. 2, the second plasma etch process may be initiated to extend the opening 310 deeper into the layer-to-be-patterned 304. Note that the first plasma etch process 230 has adjusted the width of the openings 310 by forming the modified lining 316 to have the desired thickness. Thus, it is desired that the second plasma etch process, referred to in box 240, be configured such that the thickness of the modified lining 316, as illustrated in FIG. 3E, remains unaltered while the depth of the opening 310 is increased from the first depth (in FIG. 3E) to a second depth.

Figure 3F:
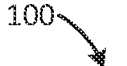
Figure 3F:
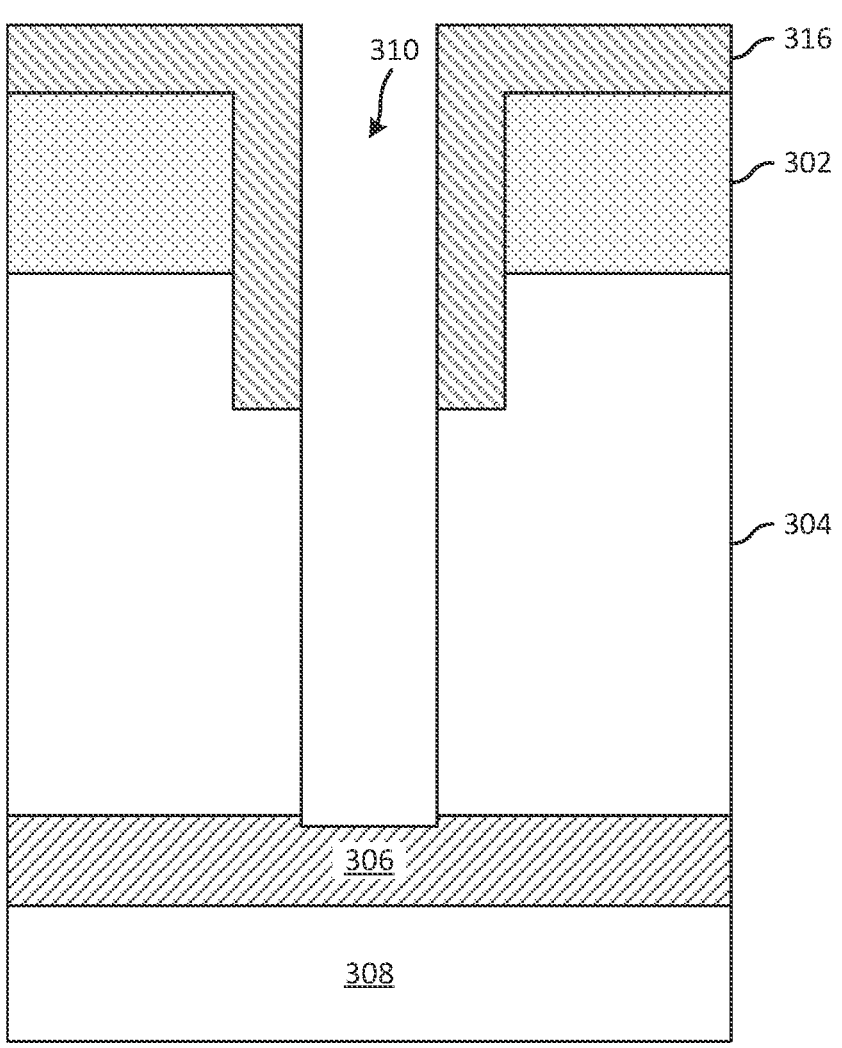

FIG. 3F illustrates a cross-sectional view of the substrate 100 after the second plasma etch process (box 240) has extended the opening 310 of the example embodiment, illustrated in FIG. 3E, to the respective opening 310 illustrated in FIG. 3F. In this embodiment, the underlying layer 306 is serving as an etch stop layer for the second plasma etch process (box 240). As illustrated in FIG. 3F, the second plasma etch process (box 240) has etched through the layer-to-be-patterned 304 and terminated in the underlying layer 306 of the substrate 100. Here, the second depth of the opening 310 is considered to be equal to the thickness of the layer-to-be-patterned 304. In some other embodiment, the second plasma etch process (box 240) may be terminated earlier for the opening to have the second depth be less than the thickness of the thickness of the layer-to-be-patterned 304.

In some embodiments, the second plasma etch process (box 240) may be a cyclic second plasma etch process similar to the first plasma etch process 230, described above, except the deposition-etch step may be modified to suppress the sputtering of the target material since it is desirable to leave the thickness of the modified lining 316 unaltered from the value at the end of the first plasma etch process 230.

In some other embodiments, the second plasma etch process (box 240) may be a continuous anisotropic RIE process. In various embodiments, the second plasma etch process (box 240) may be performed in situ.

In the cyclic second plasma etch process, the respective deposition step may be performed by exposing the substrate to a fourth plasma generated in the plasma chamber 110 from a fourth gas comprising a fluorocarbon and the first inert gas, the fourth plasma being generated using a fourth RF bias power and a fourth RF source power. In some embodiments, the deposition step of the cyclic second plasma etch process may be same as the deposition step of the first plasma etch process 230.

In the cyclic second plasma etch process, after completing the deposition step, and while flowing the second inert gas, a fifth plasma may be generated over the substrate using a fifth RF bias power and a fifth RF source power to extend the opening 310 deeper into the layer-to-be-patterned 304. In some embodiments, the target electrode 150 may be coupled to a second DC bias from the DC bias power supply 165. The second DC bias may be positive relative to the first DC bias in order to suppress the sputtering of the target material. In some embodiments, the DC bias power supply 165 may be decoupled from the target electrode 150.

After completing exposing the substrate to the fifth plasma to extend the opening 310 deeper into the layer-to-be-patterned 304, the substrate 100 may be exposed to a sixth plasma generated in the plasma chamber 110 using a sixth RF bias power and a sixth RF source power. Similar to the third plasma in the first plasma etch process 230, the sixth plasma may be configured to perform a flush step to remove remaining organic material. In some embodiments, the flush step in the cyclic second plasma etch process may be same as the respective flush step (box 236) in the first plasma etch process 230. In some embodiments, since the opening 310 has a higher aspect ratio, the flush step in the cyclic second plasma etch process may differ from the respective flush step (box 236) in the first plasma etch process 230 in order to remove any organic material remaining at the bottom of the opening 310.

The first DC bias, applied to the target electrode 150 in the deposition-etch step (box 234) of the first plasma etch 230, may affect the sidewall profile of the opening 310. By performing theoretical computations and controlled experiments, the inventors have determined that there is an optimum value for a magnitude of the first DC bias (the polarity of the first DC bias being negative) that may be used to target vertical sidewalls of the opening. The computations use theoretical models calibrated with experimental data.

Figure 4A:
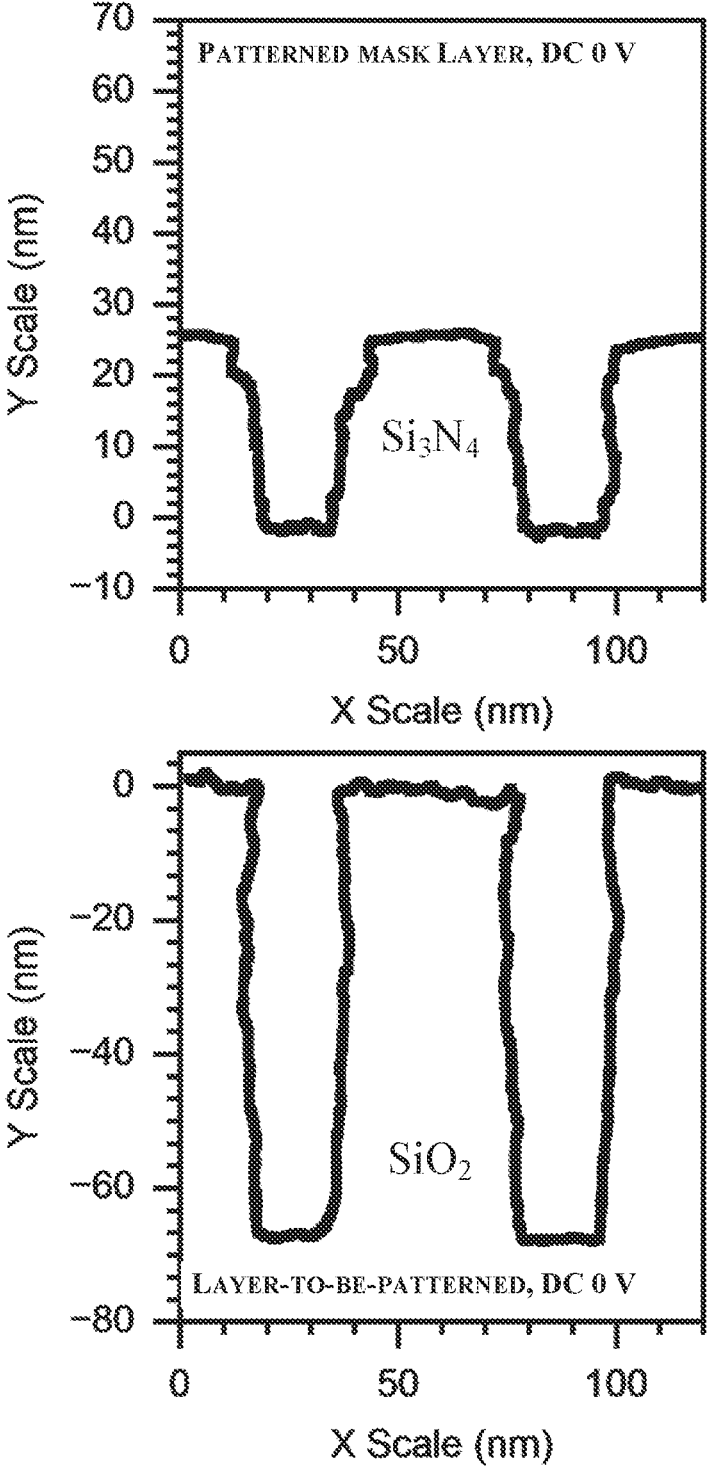
FIGS. 4A-4C illustrate plots of theoretically computed sidewall profiles of openings in a silicon nitride patterned mask layer and a silicon oxide layer-to-be-patterned etched using three different etch process recipes, in accordance with some embodiments.
Figure 4B:
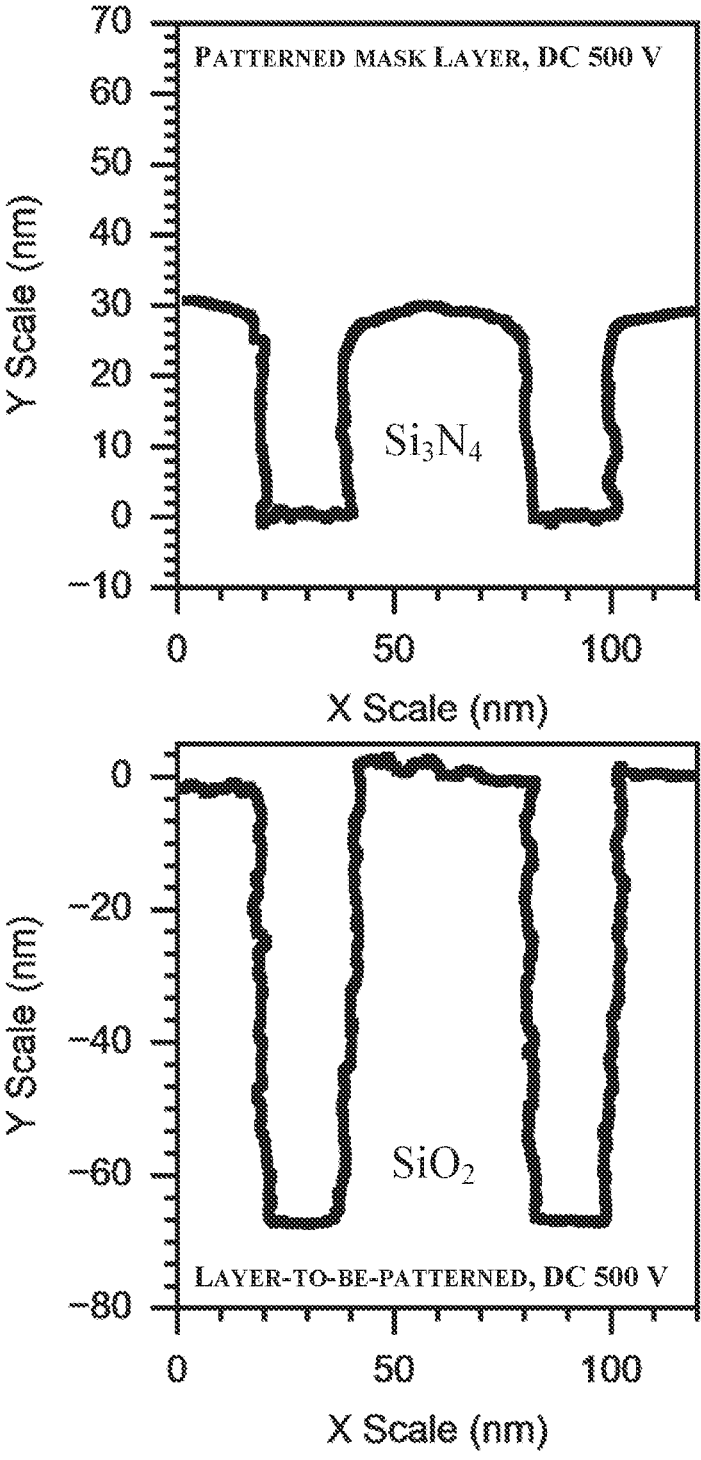
Figure 4C:
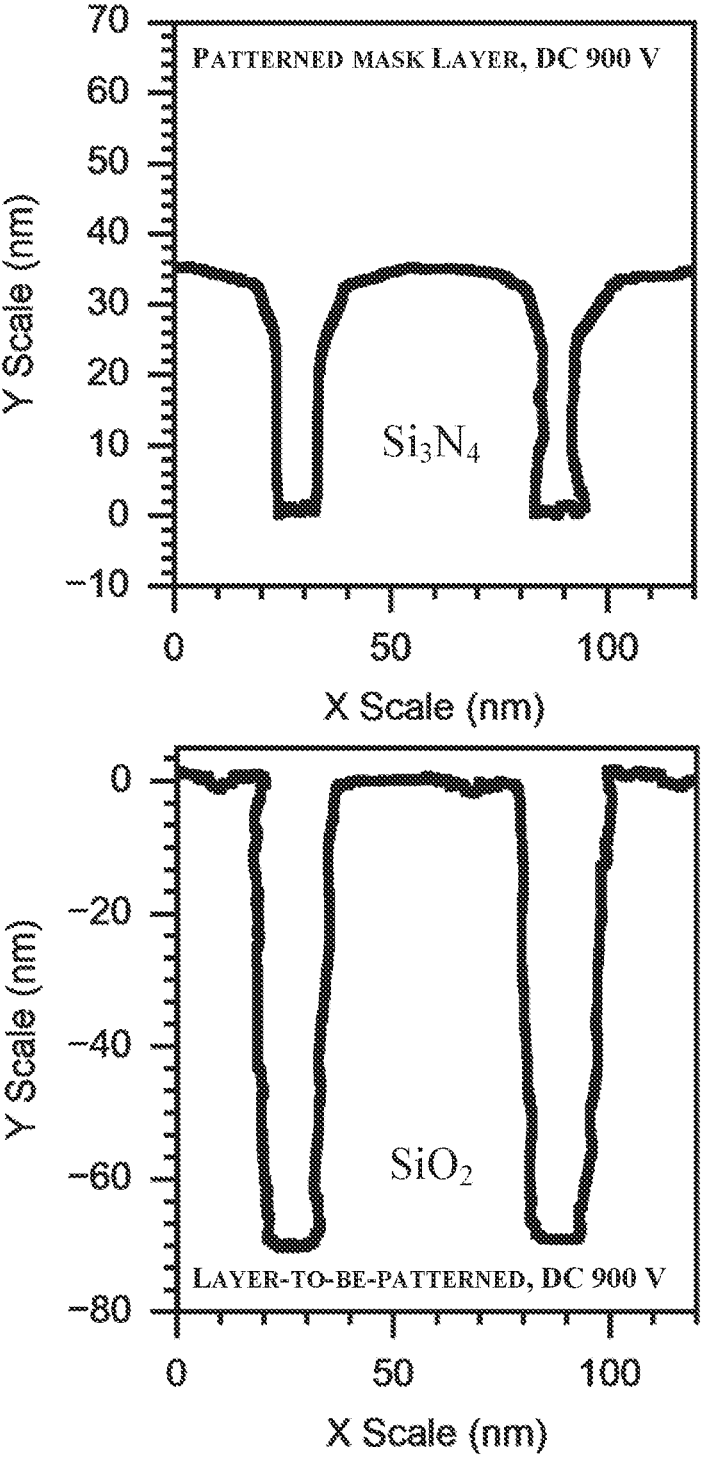

FIGS. 4A-4C illustrate plots of theoretically computed sidewall profiles of openings 310, etched using the plasma etch process of the method 20, described above with reference to the plasma system 10 in FIG. 1, the flowchart illustrated in FIG. 2, and the cross-sectional views of the substrate 100 in FIGS. 3A-3F. The computations assume that the patterned mask layer 302 comprises silicon nitride, and the layer-to-be-patterned 304 comprises silicon oxide. Sidewall profiles for three different etch process recipes using three different values of the magnitude of the first DC bias are shown in FIGS. 4A-4C. The three values are 0 V, 500 V, and 900 V (in magnitude). Note that the polarity of the first DC bias is negative, i.e., the first DC bias values are 0 V, −500 V and −900 V. Each profile is illustrated by plotting a two-dimensional (x-y) boundary of the openings 310 along the width direction (x-direction) and the depth direction (y-direction), where y=0 nm (the reference plane) is the interface between the bottom of the patterned mask layer 302 and the top of the layer-to-be-patterned 304. In each of the FIGS. 4A-4C, the sidewall profile is shown as two plots, a first plot shows the sidewall profile in the patterned mask layer 302 (y≥0 nm), and a second plot (below the first plot) shows the sidewall profile in the layer-to-be-patterned 304 (y≤0 nm). The results for first DC bias magnitudes of 0 V, 500 V, and 900 V, are plotted in FIG. 4A, FIG. 4B, and FIG. 4C, respectively. As mentioned above, the polarity of the first DC bias is negative.

The sidewall profiles, plotted in FIGS. 4A-4C, indicate that, in this example, the optimum magnitude of the first DC bias may be close to 500 V. For example, if the first DC bias is selected to have a low magnitude, for example, magnitude of zero volts, then the sidewall profile shows an enlargement of the width dimension of the opening in a region close to the top of the patterned etch mask. If the magnitude of the first DC bias is selected to be excessively high, for example, magnitude of 900 volts, then there may be flaring in the region close to the top of the patterned etch mask 302. Moreover, bowing is seen in the sidewall profile of the layer-to-be-patterned 304.

Figure 5:
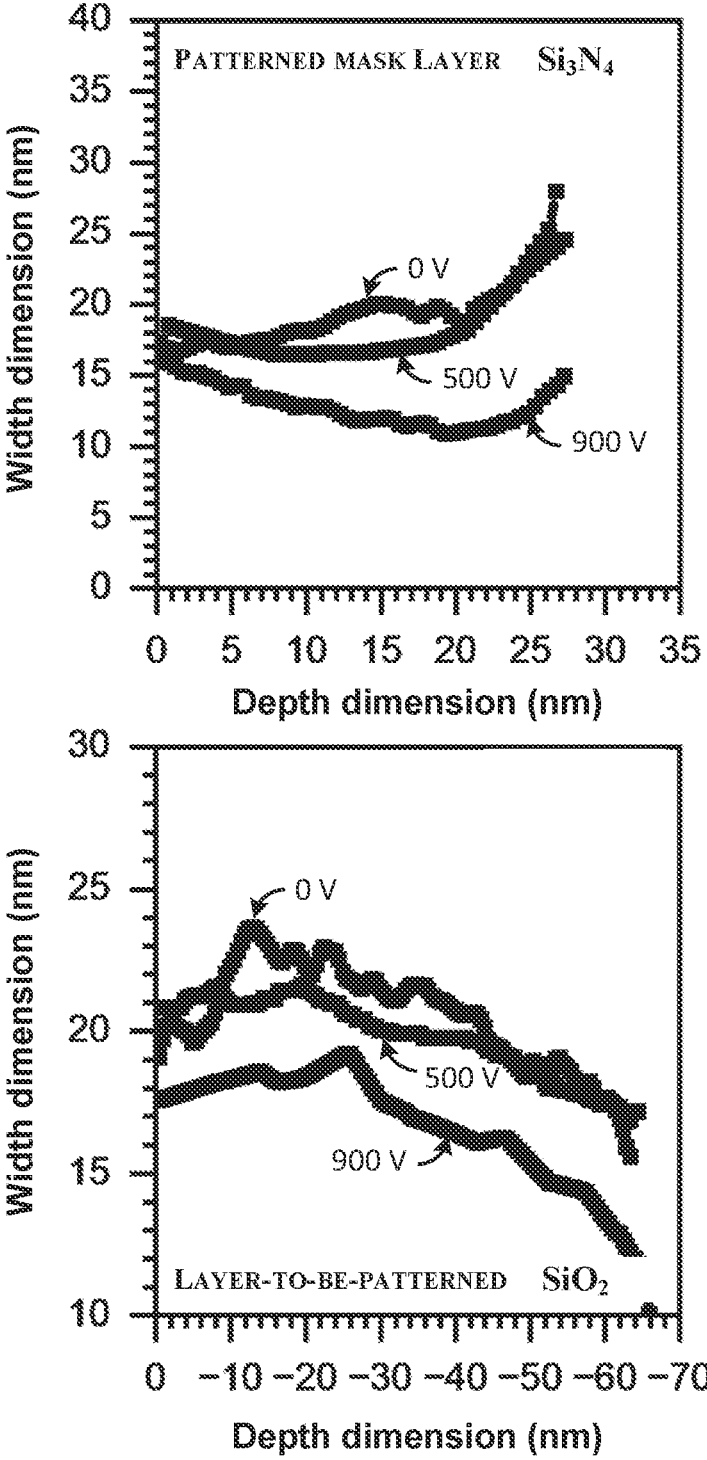
FIG. 5 illustrates plots of variations of a width dimension of each opening along its depth dimension, for the sidewall profiles illustrated in FIGS. 4A-4C.

FIG. 5 illustrates plots of variations of a width dimension of one opening along its depth dimension, for the sidewall profiles illustrated in FIGS. 4A-4C. Similar to FIGS. 4A-4C, in FIG. 5, the plot shown near the top is from the sidewall profiles in the patterned mask layer 302 (i.e., depth dimension ≥0 nm), and the plot shown near the bottom is from the sidewall profiles in the layer-to-be-patterned 304 (i.e., depth dimension ≤0 nm).

Note that, in all the plots, the reference plane (zero depth dimension) is the interface between the patterned mask layer 302 and the layer-to-be-patterned 304. Accordingly, in the plot for the patterned mask layer 302 in FIG. 5, increasing the depth dimension from 0 nm to more positive values implies moving upwards, away from the bottom of the patterned mask layer 302 and toward the top of the substrate 100. Likewise, in the plot for the patterned mask layer 304 in FIG. 5, decreasing the depth dimension from 0 nm to more negative values implies moving downward, away from the top of the patterned mask layer 302 and toward the bottom of the opening 310.

Typically, a vertical sidewall profile is desired for the opening 310. Clearly, if the sidewalls are vertical then the width dimension of the opening 310 would be constant along the depth direction. The plot for the layer-to-be-patterned 304 in FIG. 5 indicates that the sidewall profile corresponding to the magnitude of the first DC bias equal to 500 V is closest to a vertical profile, particularly in the region within 40 nm from the top of the layer-to-be-patterned 304 (i.e., in the region where the depth dimension, y, varies from −40 nm to 0 nm).

Likewise, the plot for the patterned mask layer 304 in FIG. 5 indicates that the sidewall profile corresponding to the magnitude of the first DC bias equal to 500 V is closest to a vertical profile, particularly in the region within 20 nm from the top of the layer-to-be-patterned 304 (i.e., in the region where the depth dimension, y, varies from 0 nm to 20 nm). This region of the opening 310 in the patterned mask layer 302 may be significant in determining the width of the opening 310. Note that the width dimension at the interface between the patterned mask layer 302 and the layer-to-be-patterned 304 may be considered to be the final width of the opening 310.

In various embodiments, the patterned mask layer 302 may be a sacrificial layer, which may be removed after patterning the layer-to-be-patterned 304 is complete. Accordingly, the width and sidewall profiles of the layer-to-be-patterned 304 is of higher interest.

In this disclosure we have described embodiments of a method of etching a pattern of openings in a layer-to-be-patterned through a patterned mask layer. Using this method provides the advantages of achieving improved CD control by adjusting CD and reducing random variations by forming an etch-resistant protective liner covering the patterned mask and a portion of the sidewalls. In some embodiments, the CD control may be part of an advanced process control (APC) system. The process conditions of the described method of etching may be tuned to provide openings with vertical sidewalls at a desired width.

Example embodiments of the invention are described below. Other embodiments can also be understood from the entirety of the specification as well as the claims filed herein.

Example 1. A method for fabricating a semiconductor device, where the method includes loading a substrate into a plasma chamber, the substrate including a patterned mask layer with an opening exposing a layer-to-be-patterned; and performing a number of cycles of a first plasma etch process, the first plasma etch process including: a first deposition step to conformally deposit a layer including an organic material including a fluorocarbon over the substrate, a deposition-etch step to sputter deposit a target material from a target electrode of the plasma chamber and extend the opening into the layer-to-be-patterned using an anisotropic self-limiting plasma etch process, and a first flush step to remove remaining organic material.

Example 2. The method of example 1, where, at the end of each cycle, a lining including the target material is formed on sidewalls and a top surface of the patterned mask layer while leaving a bottom of the opening exposed.

Example 3. The method of one of examples 1 or 2, where the lining protects the patterned mask layer and sidewalls of the opening from being etched during the deposition-etch step.

Example 4. The method of one of examples 1 to 3, where a thickness of the lining formed on sidewalls of the opening increases with increasing number of cycles of the first plasma etch process.

Example 5. The method of one of examples 1 to 4, where a width of the opening being formed within the layer-to-be-patterned depends on the number of cycles of the first plasma etch process, the width decreasing with increasing number of cycles.

Example 6. The method of one of examples 1 to 5, further including, selecting the number of cycles of the first plasma etch process to obtain a desired decrease in width.

Example 7. The method of one of examples 1 to 6, further including, after completing the number of cycles of the first plasma etch process, performing a second plasma etch process, the second plasma etch process including: an anisotropic etch step to extend the opening into the layer-to-be-patterned.

Example 8. The method of one of examples 1 to 7, where the second plasma etch process etches through the layer-to-be-patterned and terminates in an underlying layer of the substrate, the underlying layer being an etch stop layer for the second plasma etch process.

Example 9. The method of one of examples 1 to 8, further including, after completing the first number of cycles of the first plasma etch process, a second deposition step to conformally deposit a layer including an organic material including a fluorocarbon over the substrate; a first etch step to anisotropically extend the opening into the layer-to-be-patterned; a second flush step to remove remaining organic material; and a second etch step to anisotropically extend the opening through the layer-to-be-patterned and expose an underlying layer of the substrate.

Example 10. A method for fabricating a semiconductor device, where the method includes loading a substrate over a bottom electrode of a plasma chamber, the substrate including a patterned mask layer with an opening exposing a layer-to-be-patterned; and performing a first plasma etch process, the first plasma etch process including: exposing the substrate to a first plasma generated in the plasma chamber from a first gas including a fluorocarbon and a first inert gas, the first plasma being generated using a first radio frequency (RF) bias power and a first RF source power, after the exposing, generating a second plasma over the substrate from a second inert gas and coupling a first direct current (DC) bias to a target electrode disposed within the plasma chamber, the first DC bias being negative relative to the bottom electrode, the second plasma being generated using a second RF bias power and a second RF source power, and exposing the substrate to a third plasma configured to remove exposed organic material, the third plasma being generated in the plasma chamber using a third RF bias power and a third RF source power.

Example 11. The method of example 10, where the third plasma is generated from a gas including oxygen.

Example 12. The method of one of examples 10 or 11, where the third plasma is generated from a gas including nitrogen and hydrogen.

Example 13. The method of one of examples 10 to 12, where the second RF bias power is greater than the first RF bias power and the third RF bias power.

Example 14. The method of one of examples 10 to 13, where the fluorocarbon includes $CF_4$, $C_2F_6$, $C_3F_8$, $C_4F_6$, $C_4F_8$, $CHF_3$, $CH_3F$, or $CH_2F_2$, or a combination thereof.

Example 15. The method of one of examples 10 to 14, where the second inert gas includes argon.

Example 16. The method of one of examples 10 to 15, where the target electrode includes silicon.

Example 17. The method of one of examples 10 to 16, where a magnitude of the first DC bias is between 100 V and 1000 V.

Example 18. The method of one of examples 10 to 17, further including selecting a magnitude of the first DC bias so as to obtain vertical sidewalls for the opening.

Example 19. The method of one of examples 10 to 18, further including performing a second plasma etch process, the second plasma etch process including:

exposing the substrate to a fourth plasma generated in the plasma chamber from a fourth gas including a fluorocarbon and the first inert gas, the fourth plasma being generated using a fourth RF bias power and a fourth RF source power, after the exposing and while flowing the second inert gas, generating a fifth plasma over the substrate and coupling a second DC bias to the target electrode, the second DC bias being positive relative to the first DC bias, the fifth plasma being generated using a fifth RF bias power and a fifth RF source power and exposing the substrate to a sixth plasma configured to remove exposed organic material, the sixth plasma being generated using a sixth RF bias power and a sixth RF source power.

Example 20. The method of one of examples 10 to 19, where coupling the first DC bias includes superposing the first DC bias on an RF signal coupled to the target electrode, where the RF signal provides the second RF source power.

Example 21. A method for fabricating a semiconductor device, where the method includes having, within a plasma chamber, an upper electrode and a lower electrode, where a surface of the upper electrode facing the lower electrode includes a target material; loading a substrate over the lower electrode, the substrate including an etch mask having a pattern of openings, a bottom of the openings exposing a layer-to-be-patterned; performing a first plasma etch process, the first plasma etch process being a cyclic process, each cycle of the cyclic process including a sequence of plasma process steps, the sequence including: a deposition step, where a conformal layer of organic material including a fluorocarbon is coated over the substrate; a deposition-etch step to selectively etch the layer-to-be-patterned at the bottom of the openings using an anisotropic self-limiting plasma etch and, concurrently, sputter target material over the substrate by biasing the upper electrode to a first DC bias, the sputtering forming an etch-resistant lining including the target material, where the deposition-etch step is configured to form the lining over the etch mask and sidewalls of the openings while exposing the bottom of the openings; and a flush step to remove remaining organic material.

Example 22. The method of example 21, where the first plasma etch process anisotropically recesses the bottom of the openings to a first depth into the layer-to-be-patterned, where, after performing the first plasma etch process, the method further includes performing a second plasma etch process in situ, where the upper electrode is biased to a second DC bias, the second DC bias being greater than or equal to the first DC bias, and where the bottom of the openings is recessed to a second depth into the layer-to-be-patterned, the second depth being greater than the first depth.

Example 23. The method of one of examples 21 or 22, where performing the first plasma etch process reduces a width of the openings, the width reduction depending on a thickness of the lining formed by the first plasma etch process, the thickness of the lining depending on a total number of cycles of the first plasma etch process and where the method further includes selecting the total number of cycles of the first plasma etch process to obtain a desired thickness of the lining.

Example 24. The method of one of examples 21 to 23, where a sidewall profile of the openings depends on the first DC bias, and where the method further includes selecting the first DC bias to obtain a desired sidewall profile of the openings.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a semiconductor device, the method comprising:

loading a substrate into a plasma chamber, the substrate comprising a patterned mask layer with an opening exposing a layer-to-be-patterned; and performing a number of cycles of a first plasma etch process, the first plasma etch process comprising:

a first deposition step to conformally deposit a layer comprising an organic material comprising a fluorocarbon over the substrate, a deposition-etch step to sputter deposit a target material from a target electrode of the plasma chamber and extend the opening into the layer-to-be-patterned using an anisotropic self-limiting plasma etch process, and a first flush step to remove remaining organic material.

2. The method of claim 1, wherein, at the end of each cycle, a lining comprising the target material is formed on sidewalls and a top surface of the patterned mask layer while leaving a bottom of the opening exposed, wherein the lining protects the patterned mask layer and sidewalls of the opening from being etched during the deposition-etch step.

3. The method of claim 2, wherein a thickness of the lining formed on sidewalls of the opening increases with an increasing number of cycles of the first plasma etch process.

4. The method of claim 1, wherein a width of the opening being formed within the layer-to-be-patterned depends on the number of cycles of the first plasma etch process, the width decreasing with an increasing number of cycles.

5. The method of claim 4, further comprising, selecting the number of cycles of the first plasma etch process to obtain a desired decrease in width.

6. The method of claim 1, further comprising, after completing the number of cycles of the first plasma etch process, performing a second plasma etch process, the second plasma etch process comprising:

an anisotropic etch step to extend the opening into the layer-to-be-patterned.

7. The method of claim 6, wherein the second plasma etch process etches through the layer-to-be-patterned and terminates in an underlying layer of the substrate, the underlying layer being an etch stop layer for the second plasma etch process.

8. The method of claim 1, further comprising, after completing a first number of cycles of the first plasma etch process, a second deposition step to conformally deposit a layer comprising an organic material comprising a fluorocarbon over the substrate;

a first etch step to anisotropically extend the opening into the layer-to-be-patterned;

a second flush step to remove remaining organic material; and a second etch step to anisotropically extend the opening through the layer-to-be-patterned and expose an underlying layer of the substrate.

9. A method for fabricating a semiconductor device, the method comprising:

loading a substrate over a bottom electrode of a plasma chamber, the substrate comprising a patterned mask layer with an opening exposing a layer-to-be-patterned; and performing a first plasma etch process, the first plasma etch process comprising:

exposing the substrate to a first plasma generated in the plasma chamber from a first gas comprising a fluorocarbon and a first inert gas, the first plasma being generated using a first radio frequency (RF) bias power and a first RF source power, after the exposing, generating a second plasma over the substrate from a second inert gas and coupling a first direct current (DC) bias to a target electrode disposed within the plasma chamber, the first DC bias being negative relative to the bottom electrode, the second plasma being generated using a second RF bias power and a second RF source power, and exposing the substrate to a third plasma configured to remove exposed organic material, the third plasma being generated in the plasma chamber using a third RF bias power and a third RF source power.

10. The method of claim 9, wherein the third plasma is generated from a gas comprising oxygen.

11. The method of claim 9, wherein the third plasma is generated from a gas comprising nitrogen and hydrogen.

12. The method of claim 9, wherein the second RF bias power is greater than the first RF bias power and the third RF bias power.

13. The method of claim 9, wherein the target electrode comprises silicon.

14. The method of claim 9, further comprising selecting a magnitude of the first DC bias so as to obtain vertical sidewalls for the opening.

15. The method of claim 9, further comprising performing a second plasma etch process, the second plasma etch process comprising:

exposing the substrate to a fourth plasma generated in the plasma chamber from a fourth gas comprising a fluorocarbon and the first inert gas, the fourth plasma being generated using a fourth RF bias power and a fourth RF source power, after the exposing and while flowing the second inert gas, generating a fifth plasma over the substrate and coupling a second DC bias to the target electrode, the second DC bias being positive relative to the first DC bias, the fifth plasma being generated using a fifth RF bias power and a fifth RF source power and exposing the substrate to a sixth plasma configured to remove exposed organic material, the sixth plasma being generated using a sixth RF bias power and a sixth RF source power.

16. The method of claim 9, wherein coupling the first DC bias comprises superposing the first DC bias on an RF signal coupled to the target electrode, wherein the RF signal provides the second RF source power.

17. A method for fabricating a semiconductor device, the method comprising:

having, within a plasma chamber, an upper electrode and a lower electrode, wherein a surface of the upper electrode facing the lower electrode comprises a target material;

loading a substrate over the lower electrode, the substrate comprising an etch mask having a pattern of openings, a bottom of the openings exposing a layer-to-be-patterned;

performing a first plasma etch process, the first plasma etch process being a cyclic process, each cycle of the cyclic process comprising a sequence of plasma process steps, the sequence comprising:

a deposition step, wherein a conformal layer of organic material comprising a fluorocarbon is coated over the substrate;

a deposition-etch step to selectively etch the layer-to-be-patterned at the bottom of the openings using an anisotropic self-limiting plasma etch and, concurrently, sputter the target material over the substrate by biasing the upper electrode to a first DC bias, the sputtering forming an etch-resistant lining comprising the target material, wherein the deposition-etch step is configured to form the lining over the etch mask and sidewalls of the openings while exposing the bottom of the openings; and a flush step to remove remaining organic material.

18. The method of claim 17, wherein the first plasma etch process anisotropically recesses the bottom of the openings to a first depth into the layer-to-be-patterned, wherein, after performing the first plasma etch process, the method further comprises performing a second plasma etch process in situ, wherein the upper electrode is biased to a second DC bias, the second DC bias being greater than or equal to the first DC bias, and wherein the bottom of the openings is recessed to a second depth into the layer-to-be-patterned, the second depth being greater than the first depth.

19. The method of claim 17, wherein performing the first plasma etch process reduces a width of the openings, the width reduction depending on a thickness of the lining formed by the first plasma etch process, the thickness of the lining depending on a total number of cycles of the first plasma etch process and wherein the method further comprises selecting the total number of cycles of the first plasma etch process to obtain a desired thickness of the lining.

20. The method of claim 17, wherein a sidewall profile of the openings depends on the first DC bias, and wherein the method further comprises selecting the first DC bias to obtain a desired sidewall profile of the openings.

* * * * *